United States Patent
Lin et al.

(10) Patent No.: US 11,626,510 B2
(45) Date of Patent: Apr. 11, 2023

(54) FIN FIELD-EFFECT TRANSISTOR AND METHOD OF FORMING THE SAME

(71) Applicant: Taiwan Semiconductor Manufacturing Company, Ltd., Hsinchu (TW)

(72) Inventors: Shih-Yao Lin, New Taipei (TW); Chih-Han Lin, Hsinchu (TW); Shu-Uei Jang, Hsinchu (TW); Ya-Yi Tsai, Hsinchu (TW); Chi-Hsiang Chang, Taoyuan (TW); Tzu-Chung Wang, Hsinchu (TW); Shu-Yuan Ku, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/582,729

(22) Filed: Jan. 24, 2022

(65) Prior Publication Data
US 2022/0149181 A1    May 12, 2022

Related U.S. Application Data

(63) Continuation of application No. 16/913,570, filed on Jun. 26, 2020, now Pat. No. 11,233,139.

(51) Int. Cl.
*H01L 31/119*    (2006.01)
*H01L 29/76*    (2006.01)
(Continued)

(52) U.S. Cl.
CPC .. *H01L 29/6681* (2013.01); *H01L 21/823431* (2013.01); *H01L 29/0649* (2013.01); *H01L 29/41791* (2013.01); *H01L 29/785* (2013.01)

(58) Field of Classification Search
CPC ......... H01L 29/6681; H01L 21/823431; H01L 29/0649; H01L 29/41791; H01L 29/785;
(Continued)

(56) References Cited

U.S. PATENT DOCUMENTS 9,972,495 B1 *    5/2018  Wu ................. H01L 21/823437
10,083,874 B1 *   9/2018  Yu ...................... H01L 29/66545
(Continued)

FOREIGN PATENT DOCUMENTS

TW    201445623 A    12/2014
TW    201807822 A    3/2018
(Continued)

OTHER PUBLICATIONS

Notice of Allowance on U.S. Appl. No. 16/913,570 dated Aug. 30, 2021.

*Primary Examiner* — Theresa T Doan
(74) *Attorney, Agent, or Firm* — Foley & Lardner LLP

(57) ABSTRACT

A method includes forming a first fin and a second fin over a substrate. The method includes forming a first dummy gate structure that straddles the first fin and the second fin. The first dummy gate structure includes a first dummy gate dielectric and a first dummy gate disposed over the first dummy gate dielectric. The method includes replacing a portion of the first dummy gate with a gate isolation structure. The portion of the first dummy gate is disposed over the second fin. The method includes removing the first dummy gate. The method includes removing a first portion of the first dummy gate dielectric around the first fin, while leaving a second portion of the first dummy gate dielectric around the second fin intact. The method includes forming a gate feature straddling the first fin and the second fin, wherein the gate isolation structure intersects the gate feature.

20 Claims, 25 Drawing Sheets

(51) Int. Cl.
  *H01L 29/94* (2006.01)
  *H01L 29/66* (2006.01)
  *H01L 29/417* (2006.01)
  *H01L 21/8234* (2006.01)
  *H01L 29/06* (2006.01)
  *H01L 29/78* (2006.01)

(58) Field of Classification Search
  CPC ..... H01L 21/823437; H01L 21/823481; H01L 29/0673; H01L 29/775; H01L 21/823821; H01L 21/823828; H01L 21/823857; H01L 21/823878; H01L 27/0924; B82Y 10/00
  USPC ........................................................ 257/365
  See application file for complete search history.

(56) References Cited

U.S. PATENT DOCUMENTS

| | | |
|---|---|---|
| 2011/0269287 A1 | 11/2011 | Tsai et al. |
| 2013/0244387 A1 | 9/2013 | Cho |
| 2020/0020794 A1 | 1/2020 | Lin et al. |

FOREIGN PATENT DOCUMENTS

| | | |
|---|---|---|
| TW | 201913877 A | 4/2019 |
| TW | 201933430 A | 8/2019 |

\* cited by examiner

FIN FIELD-EFFECT TRANSISTOR AND METHOD OF FORMING THE SAME

CROSS-REFERENCE TO RELATED APPLICATION

This application is related to and claims priority under 35 U.S.C. § 120 as a continuation of U.S. Utility application Ser. No. 16/913,570, filed Jun. 26, 2020, titled "FIN FIELD-EFFECT TRANSISTOR AND METHOD OF FORMING THE SAME," the entire contents of which are incorporated herein by reference for all purposes.

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises one or more fins protruding from a substrate. A gate structure, configured to control the flow of charge carriers within a conductive channel of the FinFET device, wraps around the one or more fins. For example, in a tri-gate FinFET device, the gate structure wraps around three sides of each of the one or more fins, thereby forming conductive channels on three sides of each of the one or more fins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
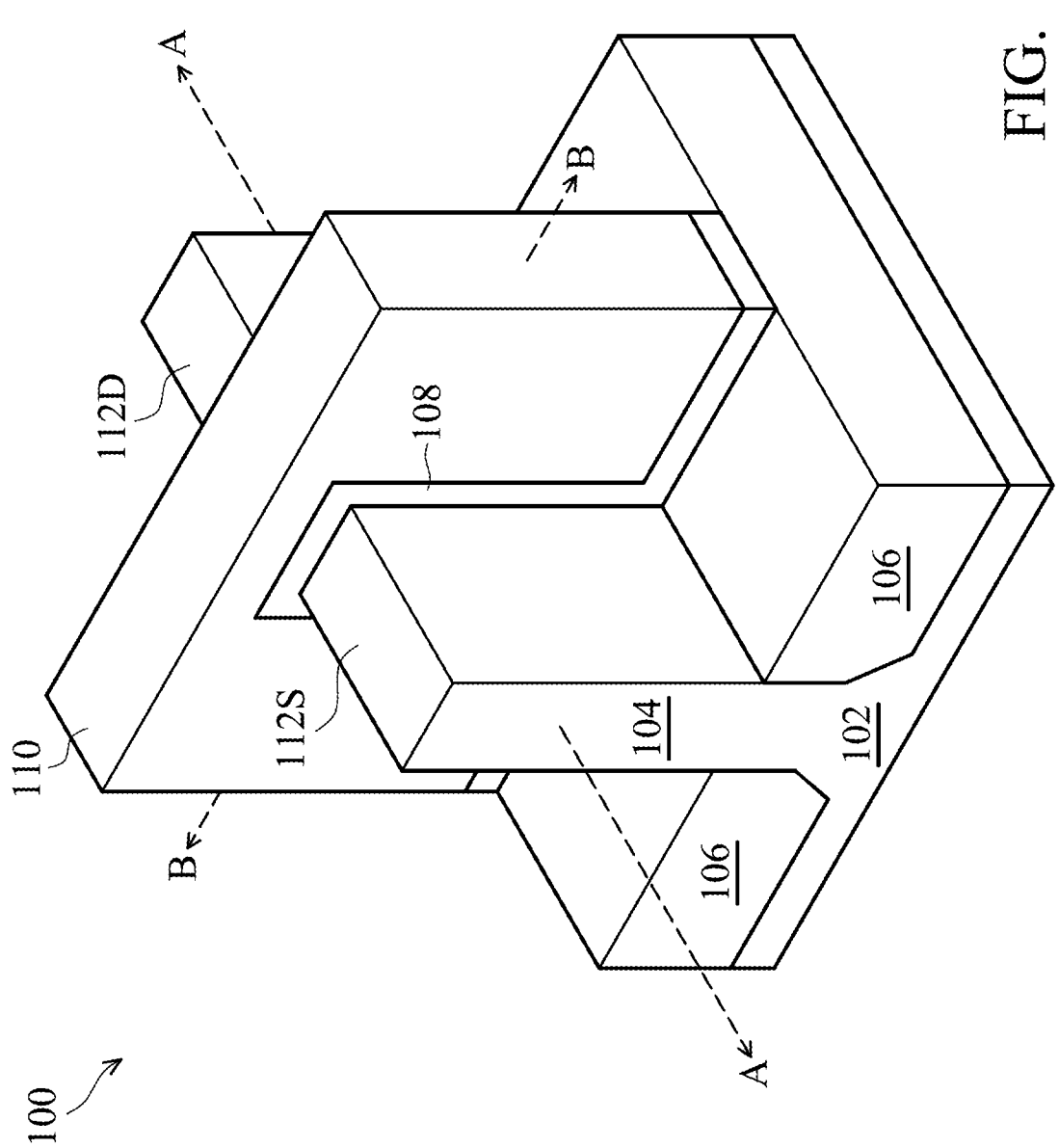
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming a replacement gate of a FinFET device. In some embodiments, a dummy gate structure is formed over a number of fins. The dummy gate structure includes a dummy gate dielectric, and a dummy gate disposed over the dummy gate dielectric. The fins can include one or more active fins and one or more dummy fins. Hereinafter, the term "active fin" is referred to as a fin that will be adopted as an active channel to electrically conduct current in a finished semiconductor device (e.g., FinFET device 300 shown below), when appropriately configured and powered; and the term "dummy fin" is referred to as a fin that will not be adopted as an active channel (i.e., a dummy channel) to electrically conduct current in a finished semiconductor device (e.g., FinFET device 300 shown below). Next, gate spacers are formed around the dummy gate structure. After an interlayer dielectric (ILD) layer is formed around the gate spacers to overlay respective source/drain regions for each of the active fins, a portion of the dummy gate over at least one of the dummy fins is replaced with a gate isolation structure. Next, the remaining portion of the dummy gate is removed, followed by a portion of the dummy gate dielectric to be removed. The removed portion of the dummy gate dielectric may be selected by a mask that blocks a portion or the whole of the at least one dummy fin. As such, a portion of the dummy gate dielectric may remain around the at least one dummy fin. A gate trench in the ILD layer, which exposes at least one of the active fins, is formed. The gate trench may be intersected by the gate isolation structure, in some embodiments. Next, a metal gate layer is formed in the gate trench to be electrically coupled to the active fin. With the portion of the dummy gate dielectric remaining around the at least one dummy fin, it can be assured that the gate isolation structure electrically isolates two respective portions of the metal gate layer intersected by the gate isolation structure.

Metal gate layers over multiple fins formed by the above described method (e.g., with a portion of dummy gate dielectric remaining around a dummy fin) can reduce metal gate leakage in advanced processing nodes. For example, the gate isolation structure is formed over the dummy fin to disconnect, intercept, cut, or otherwise traverse the metal gate layer. Forming the gate isolation structure to cut a metal gate layer may allow the metal gate layer to be electrically coupled to active fin(s). In the existing technologies, however, a dummy gate dielectric is universally removed from the active fin and the dummy fin, when forming a gate trench. In the subsequent process of forming a metal gate layer, the metal gate layer may penetrate into a void between the gate isolation structure and the dummy fin where a portion of the dummy gate dielectric is formed. As such, the two "intercepted" portions of the metal gate layer, which should have been electrically isolated from each other by the gate isolation structure, can merge in the void. The gate isolation structure can lose its electrical isolation function. Thus, undesired gate leakage may be induced.

By blocking at least a portion of the dummy fin when removing the dummy gate dielectric, a portion of the dummy gate dielectric can remain around the dummy fin. When forming the metal gate layer, the dummy fin can be surrounded, straddled, or otherwise protected by such a portion of dummy gate dielectric. Consequently, the two intercepted portions of the metal gate layer may remain electrically isolated from each other. In advanced processing nodes, such a dummy fin can be disposed next to one or more active fins (e.g., between two adjacent active fins) to improve the overall design and fabrication of a semiconductor device. For example, dummy fins can be used for optical proximity correction (OPC) to enhance a pattern density and pattern uniformity in the stage of designing the semiconductor device. In another example, adding dummy fins adjacent to active fins can improve chemical-mechanical polishing (CMP) performance when fabricating the semiconductor device. The dummy fin is designed to stay inactive or electrically non-functional, when the semiconductor device is appropriately configured and powered. Through the blocked portion of the dummy gate dielectric that remains around the dummy fin, it can be assured that the two intercepted portions of the metal gate layer remains electrically isolated from each other. In this way, the undesired gate leakage (e.g., resulting from the merge of the two intercepted portions of the metal gate layer) can be avoided, which can improve the overall performance of the semiconductor device.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
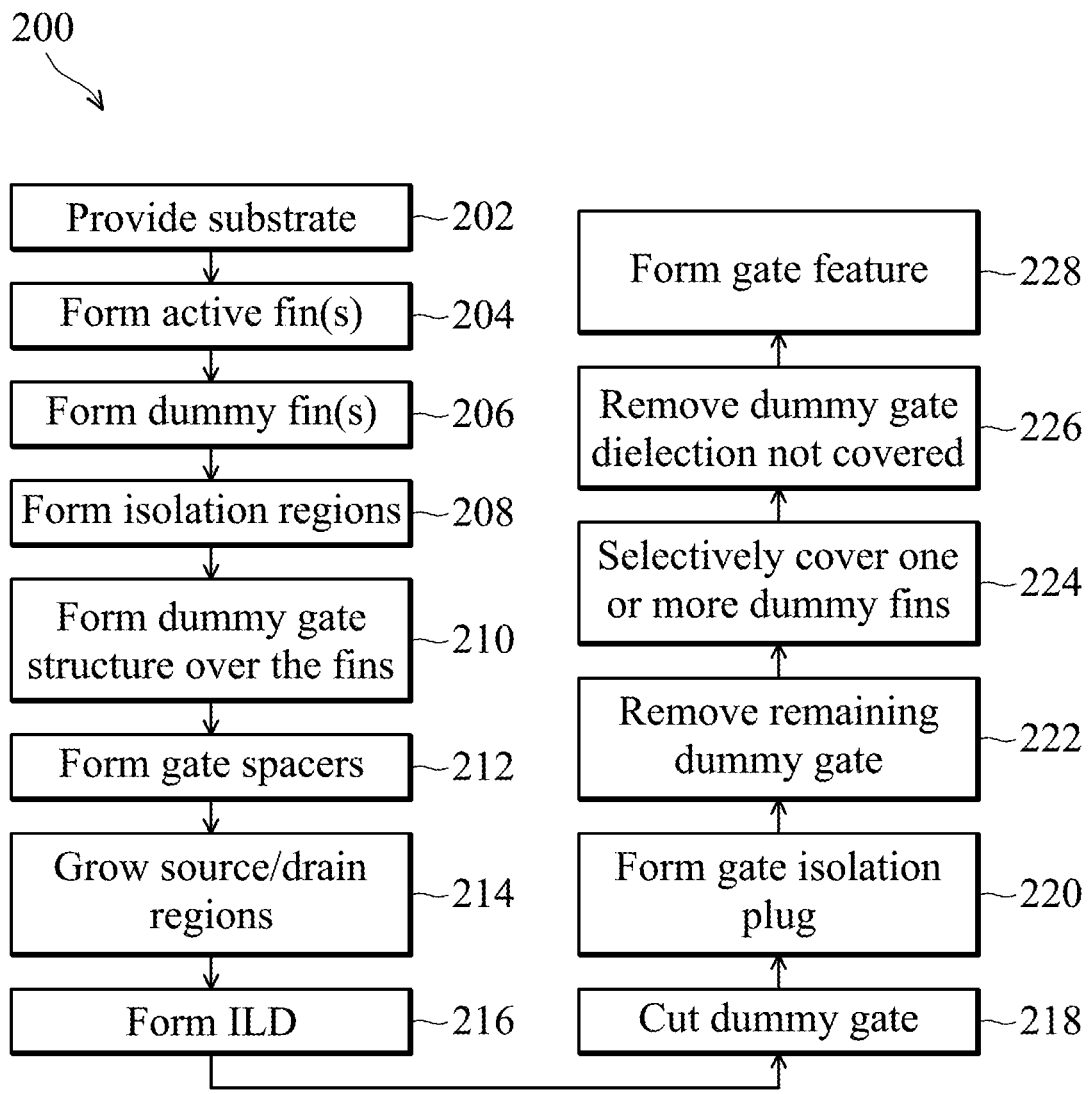
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., FinFET device 100), a nanosheet transistor device, a nanowire transistor device, a vertical transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, 14, 15, 16, 17, 18, 19, and 20, respectively, which will be discussed in further detail below.

In brief overview, the method 200 starts with operation 202 of providing a substrate. The method 200 continues to operation 204 of forming one or more active fins. The method 200 continues to operation 206 of forming one or more dummy fins. The method 200 continues to operation 208 of forming isolation regions. The method 200 continues to operation 210 of forming dummy gate structures over the fins. The dummy gate structures each include a dummy gate dielectric and a dummy gate disposed above the dummy gate dielectric. The method 200 continues to operation 212 of forming gate spacers. The gate spacers are extended along sidewalls of each of the dummy gate structures. The method 200 continues to operation 214 of growing source/drain regions. The method 200 continues to operation 216 of forming an interlayer dielectric (ILD). The method 200 continues to operation 218 of cutting the dummy gate. The method 200 continues to operation 220 of forming one or more gate isolation structures. The gate isolation structure may fill the cut portion of the dummy gate to disconnect the dummy gate. The method 200 continues to operation 222 of removing the remaining portion of the dummy gate. The method 200 continues to operation 224 of selectively covering one or more of the fins. The method 200 continues to operation 226 of removing a portion of the dummy gate dielectric that is not covered. The method 200 continues to operation 228 of forming a gate feature.

Figure 11:
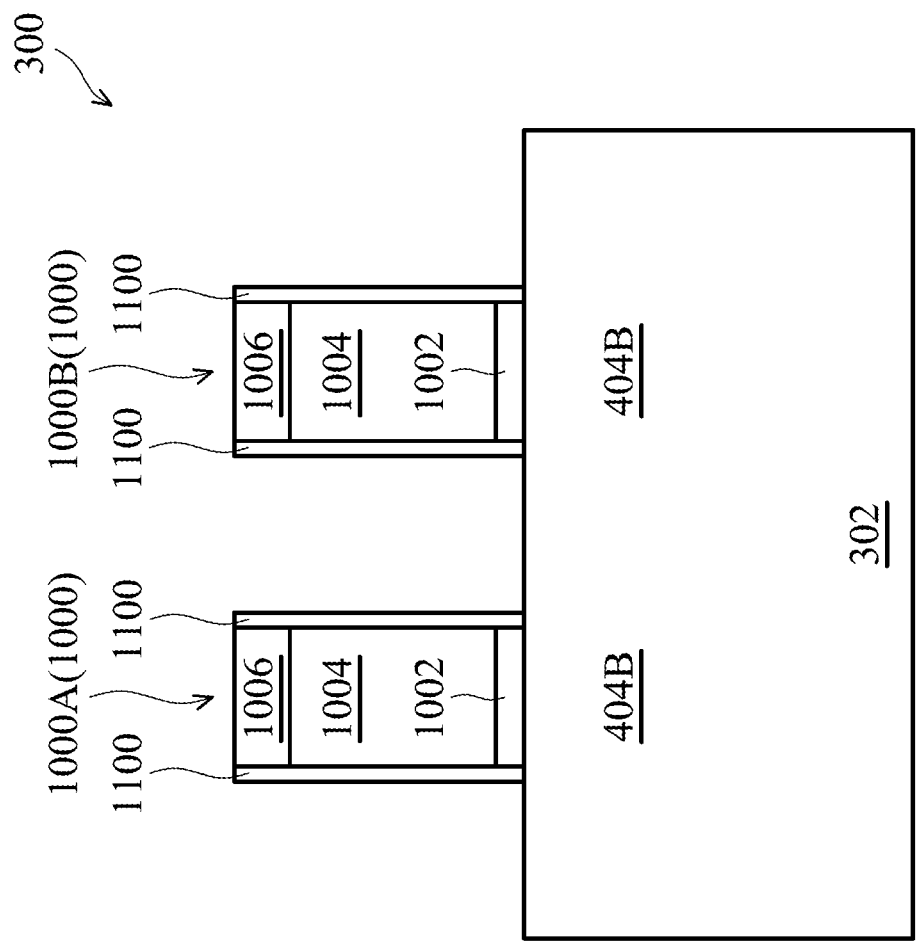
Figure 12:
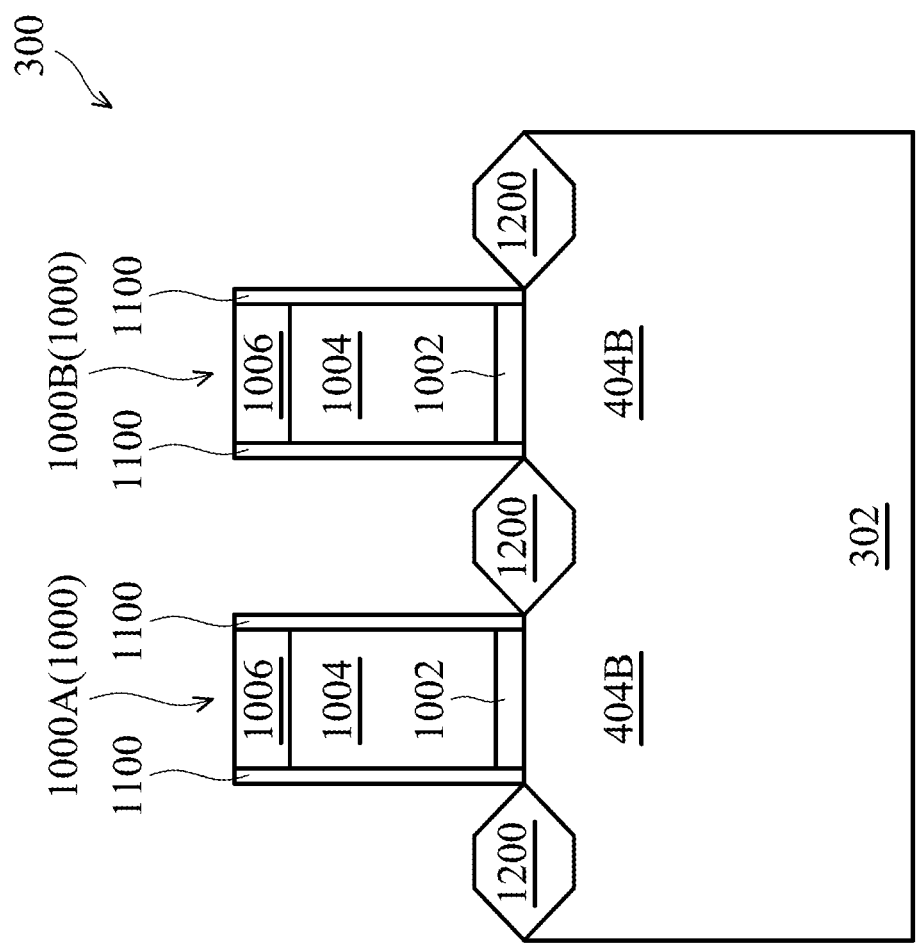
Figure 13:
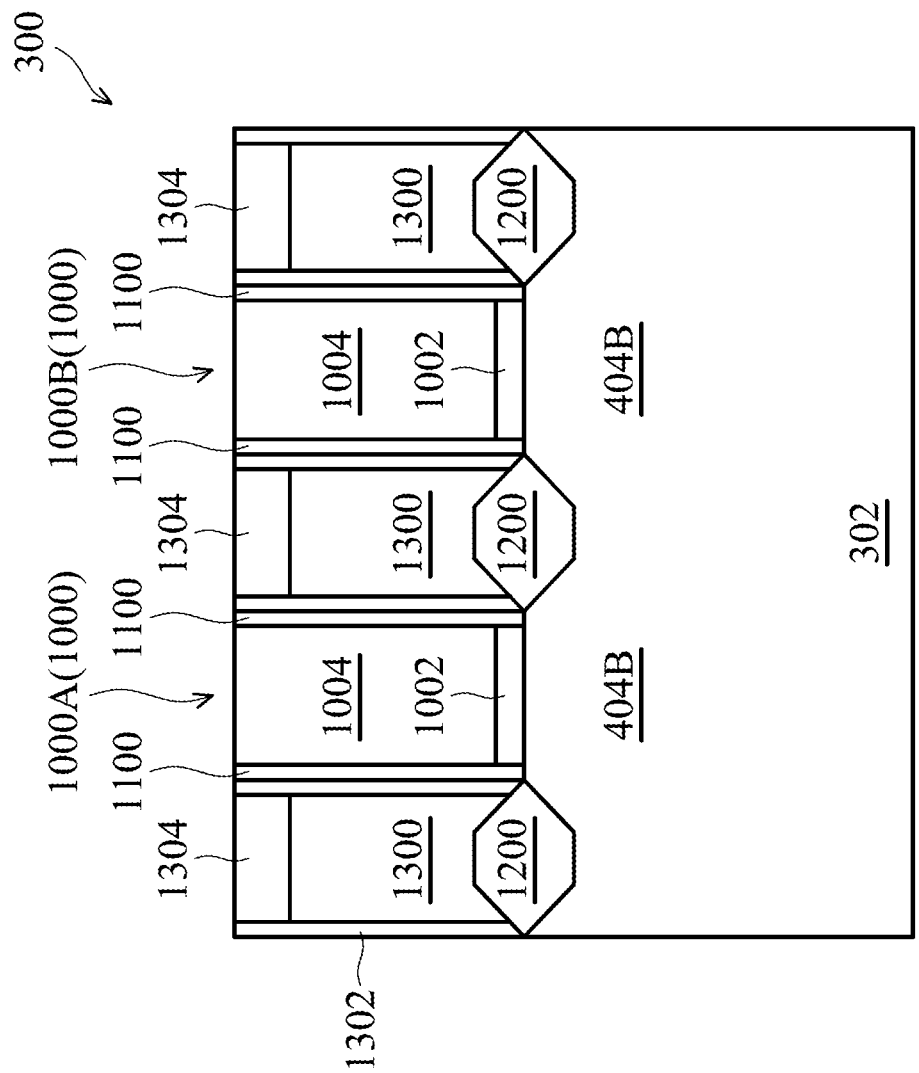

As mentioned above, FIGS. 3-20 each illustrate, in a cross-sectional view, a portion of a FinFET device 300 at various fabrication stages of the method 200 of FIG. 2. The FinFET device 300 is similar to the FinFET device 100 shown in FIG. 1, but with multiple gate structures and multiple fins. For example, FIGS. 3-10 and 14-20 illustrate cross-sectional views of the FinFET device 300 along cross-section B-B (as indicated in FIG. 1); and FIG. 11-13 illustrate cross-sectional views of the FinFET device 300 along cross-section A-A (as indicated in FIG. 1). Although FIGS. 3-20 illustrate the FinFET device 300, it is understood the FinFET device 300 may include a number of other devices such as inductors, fuses, capacitors, coils, etc., which are not shown in FIGS. 3-20, for purposes of clarity of illustration.

Figure 3:
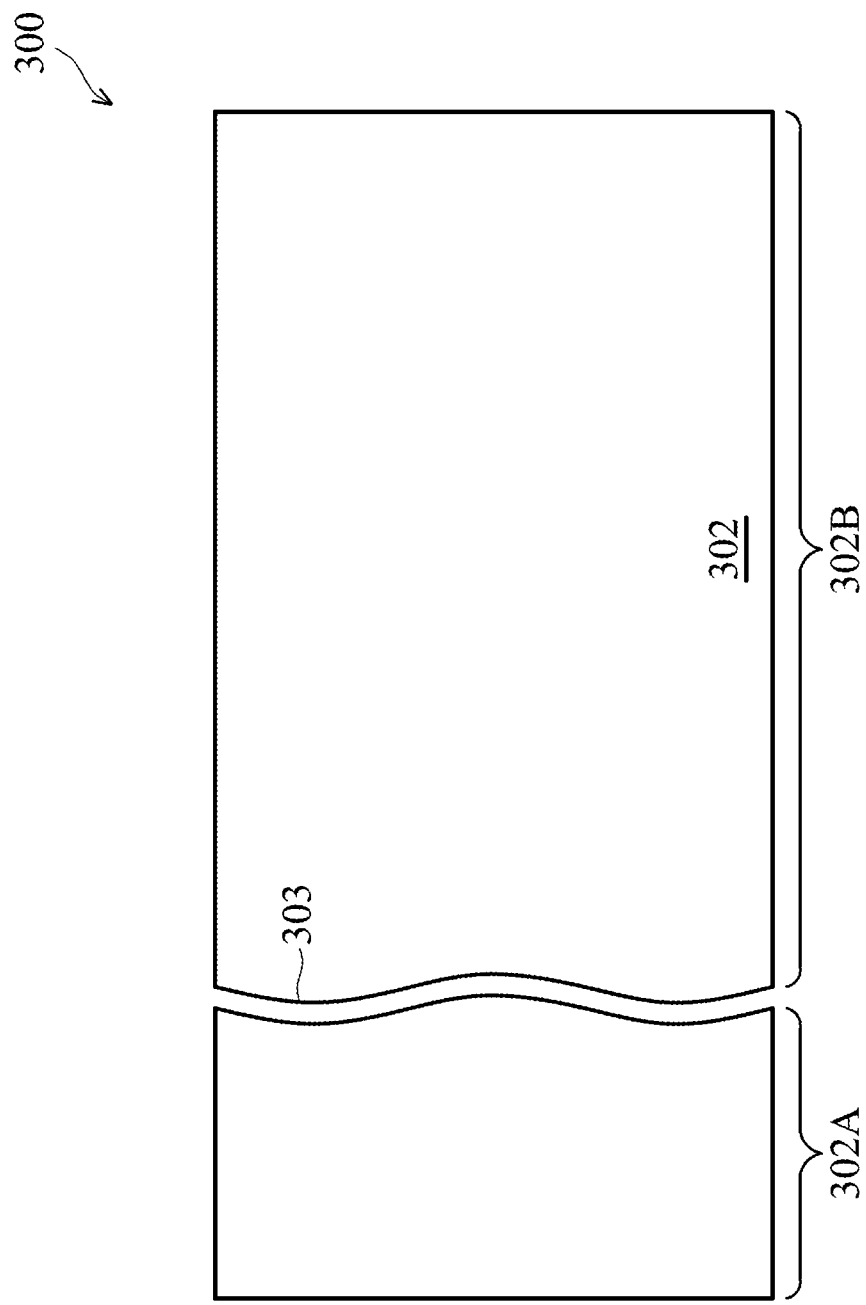
FIGS. 3, 4, 5, 6, 7, 8, 9, 10, 11, 12, 13, 14, 15, 16, 17, 18, 19, and 20 illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication. The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the FinFET device 300 can include areas 302A and 302B. The area 302A can be configured to form a number of input/output (I/O) transistors (hereinafter "I/O area 302A"); and the area 302B can be configured to form a number of core transistors (hereinafter "core area 302B"). The terms "I/O transistor" and "core transistor," as used herein, may be generally referred to a transistor configured to operate under a relatively higher voltage (e.g., higher $V_{gs}$) and a transistor configured to operate under a relatively lower voltage (e.g., lower $V_{gs}$), respectively. Thus, it should be understood that the I/O transistor can include any of various other transistors operating under a relatively higher voltage and the core transistor can include any of various other transistors operating under a relatively lower voltage, while remaining within the scope of the present disclosure. The I/O transistor, when appropriately configured, may have a relatively thicker gate dielectric; and the core transistor, when appropriately configured, has a relatively thinner gate dielectric. Further, the I/O transistors may be formed in a first area of the substrate (e.g., I/O area 302A) with a relatively lower density of transistors; and the core transistors may be formed in a second area of the substrate (e.g., core area 302B) with a relatively higher density of transistors.

As shown in FIG. 3 (and the following figures), the I/O area 302A and core area 302B are separated from each other by a divider 303, which can include additional features/components/devices that are omitted for simplicity. It should be appreciated that some of the operations of the method 200 may be concurrently performed in the I/O area 302A and core area 302B. For purposes of illustration, the feature(s) formed in the I/O area 302A and the core area 302B may be shown in the same figure that corresponds to one of the operations of the method 200.

Figure 4:
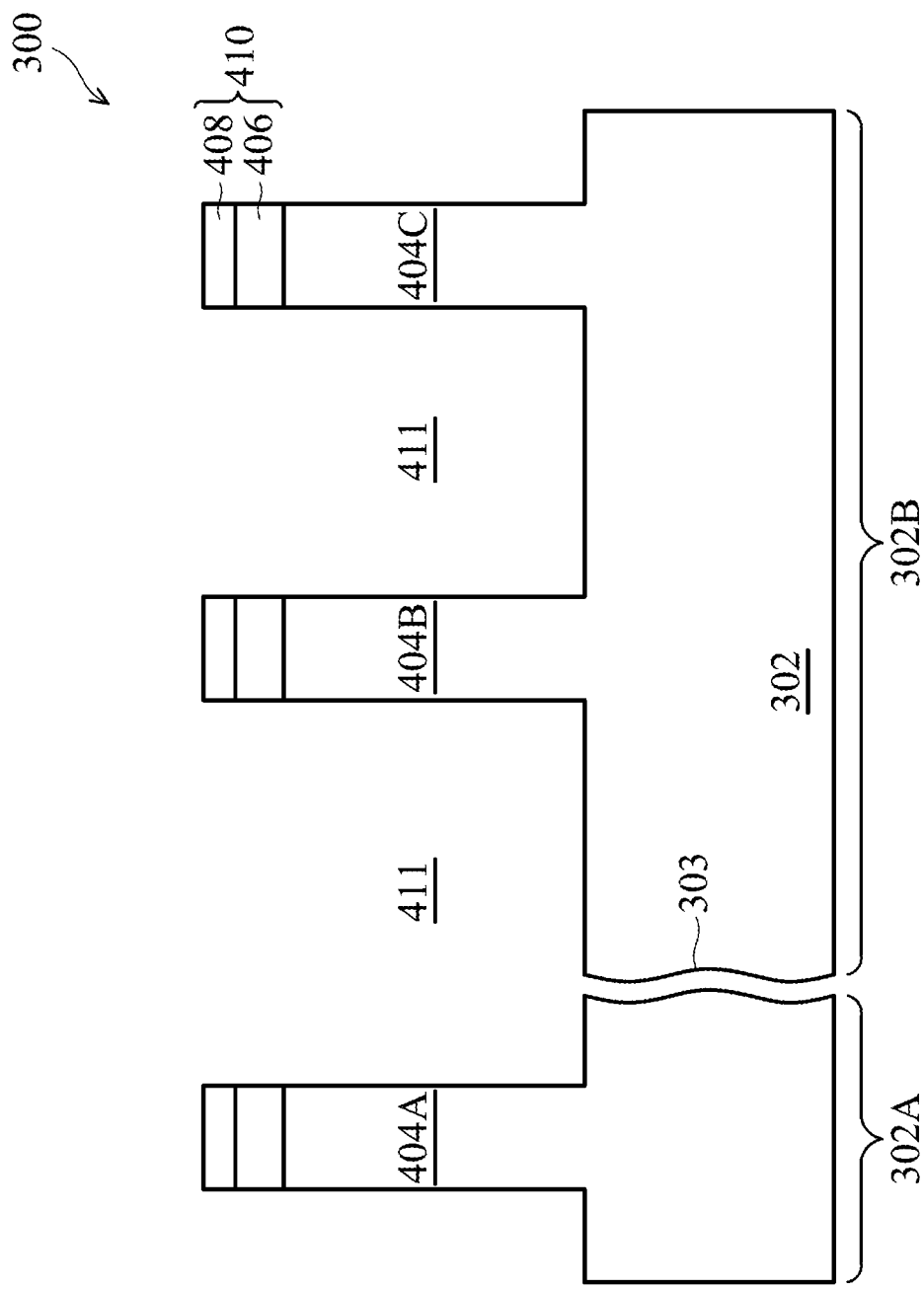

Corresponding to operation 204 of FIG. 2, FIG. 4 is a cross-sectional view of the FinFET device 300 including semiconductor fins 404A, 404B, and 404C at one of the various stages of fabrication. The semiconductor fin 404A is formed in the I/O area 302A, and the semiconductor fins 404B-C are formed in the core area 302B. Although one and two semiconductor fins are shown in the I/O area 302A and core area 302B, respectively, it should be appreciated that the FinFET device 300 can include any number of semiconductor fins in each of the areas 302A and 302B while remaining within the scope of the present disclosure.

In some embodiments, the semiconductor fins 404A-C may be each configured as an active fin, which will be adopted as an active (e.g., electrically functional) fin or channel in a completed FinFET. Further, the semiconductor fin 404A may be configured as the active channel of an input/output (I/O) transistor of the FinFET device 300 (sometimes referred to as "active I/O fin 404A"); the semiconductor fin 404B may be configured as the active channel of a first core transistor of the FinFET device 300 (sometimes referred to as "active core fin 404B"); and the fin 404C may be configured as the active channel of a second core transistor of the FinFET device 300 (sometimes referred to as "active core fin 404C").

The semiconductor fins 404A-C are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining the active fins 404A-C between adjacent trenches 411 as illustrated in FIG. 4. When multiple fins are formed, such a trench may be disposed between any adjacent ones of the fins. In some embodiments, the active fins 404A-C are formed by etching trenches in the substrate 302 using, for example, reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the active fins 404A-C.

The active fins 404A-C may be patterned by any suitable method. For example, the active fins 404A-C may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3 and 4 illustrate an embodiment of forming the active fins 404A-C, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the active fins 404A-C that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the active fins 404A-C may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
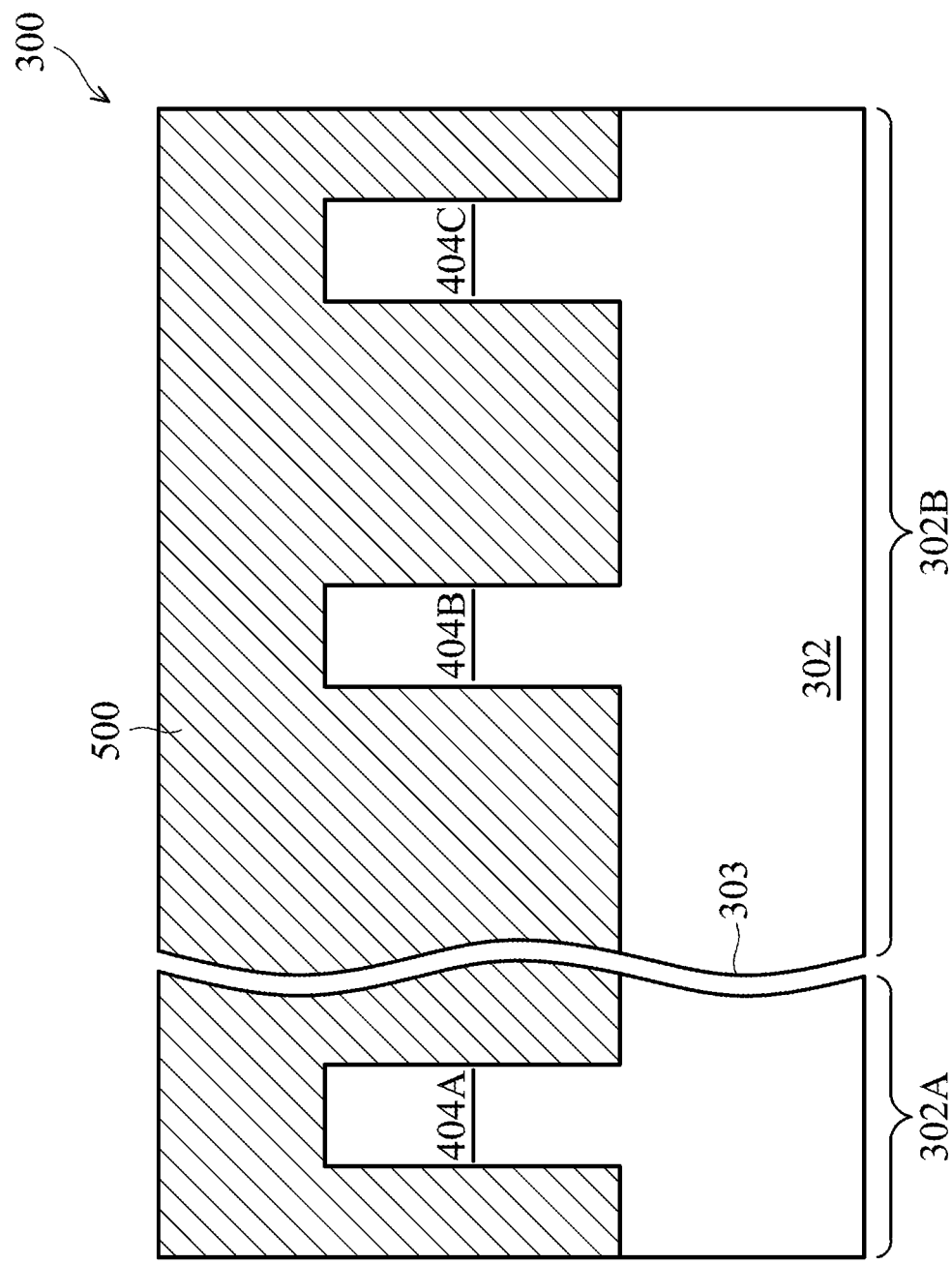
Figure 6:
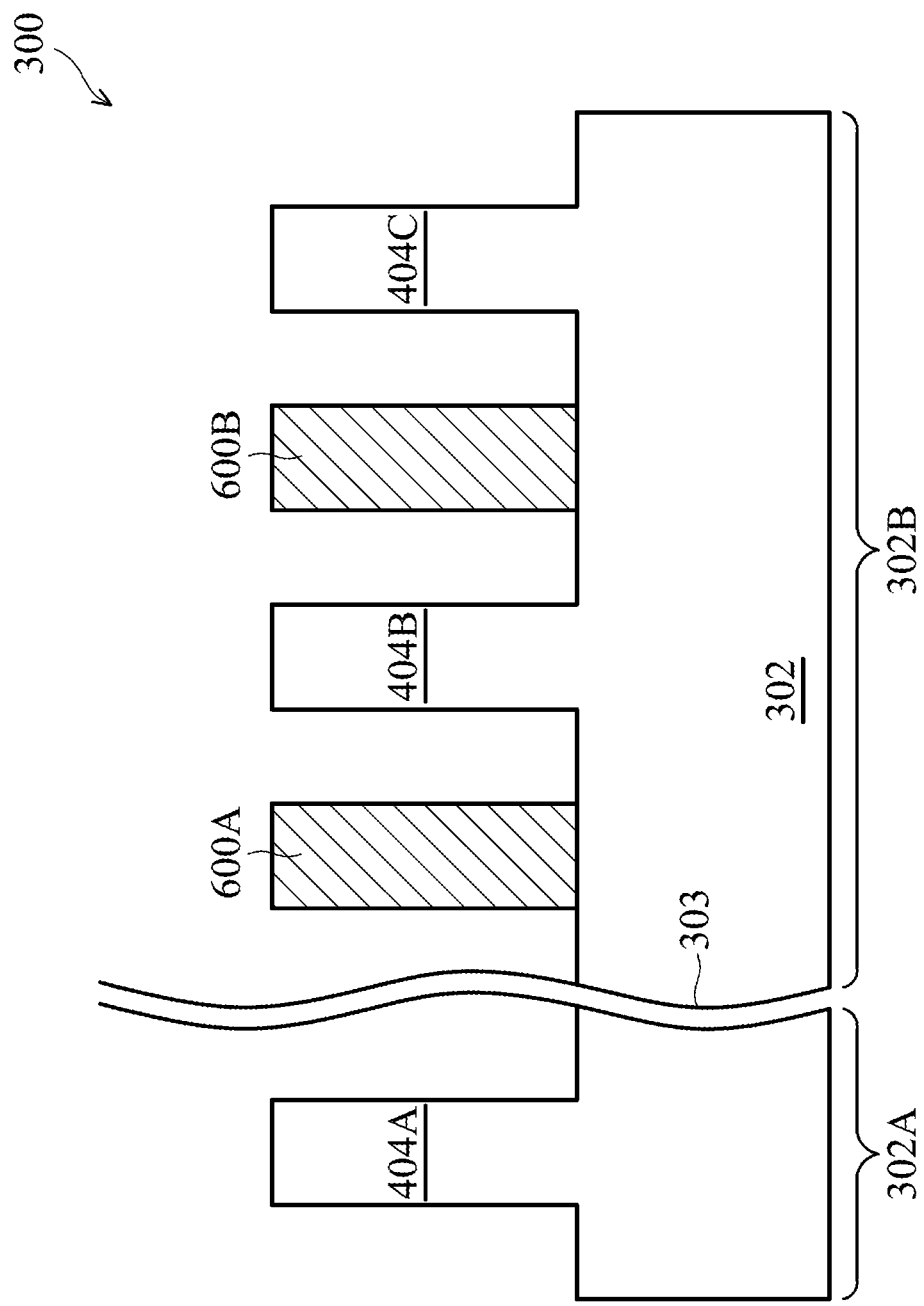

Corresponding to operation 206 of FIG. 2, FIG. 5 is a cross-sectional views of the FinFET device 300 including a dummy channel layer 500 at one of the various stages of fabrication, and FIG. 6 is a cross-sectional views of the FinFET device 300 including dummy fins 600A and 600B at one of the various stages of fabrication. Although the dummy channel layer 500 is shown as being universally deposited over both of the areas 302A and 302B, it should be understood that a similar dummy channel layer may be deposited over the area 302A concurrently with the deposition of the dummy channel layer 500 over the area 302B. Alternatively, there may be no such a dummy channel layer deposited over the area 302B.

In some embodiments, the dummy channel layer 500 can include a dielectric material used to form the dummy fins 600A-B. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The dummy channel layer 500 may be formed using low-pressure chemical vapor deposition (LPCVD) or plasma enhanced chemical vapor deposition (PECVD), for example.

Upon depositing the dummy channel layer 500 overlaying the active fins 404A-C, one or more dummy fins, e.g., 600A and 600B, may be formed between the active fins 404A-C. For example, the dummy fin 600A may be formed between the divider 303 and the active fin 404B; and the dummy fin 600B may be formed between the active fins 404B and 404C. The dummy fins 600A-B are formed by patterning the dummy channel layer 500 using, for example, photolithography and etching techniques. For example, a patterned mask 410 may be formed over the dummy channel layer 500 to mask portions of the dummy channel layer 500 to form the dummy fins 600A-B. Subsequently, unmasked portions of the dummy channel layer 500 may be etched using, for example, reactive ion etch (RIE), neutral beam etch (NBE), the like, or combinations thereof, thereby defining the dummy fins 600A-B between adjacent active fins 404A-C (or in the trenches 411) as illustrated in FIG. 6. The etch may be anisotropic, in some embodiments. In some other embodiments, the dummy fins 600A-B may be formed concurrently with or subsequently to forming isolation regions (e.g., 700 of FIG. 7) between adjacent fins, which will be discussed below.

Figure 7:
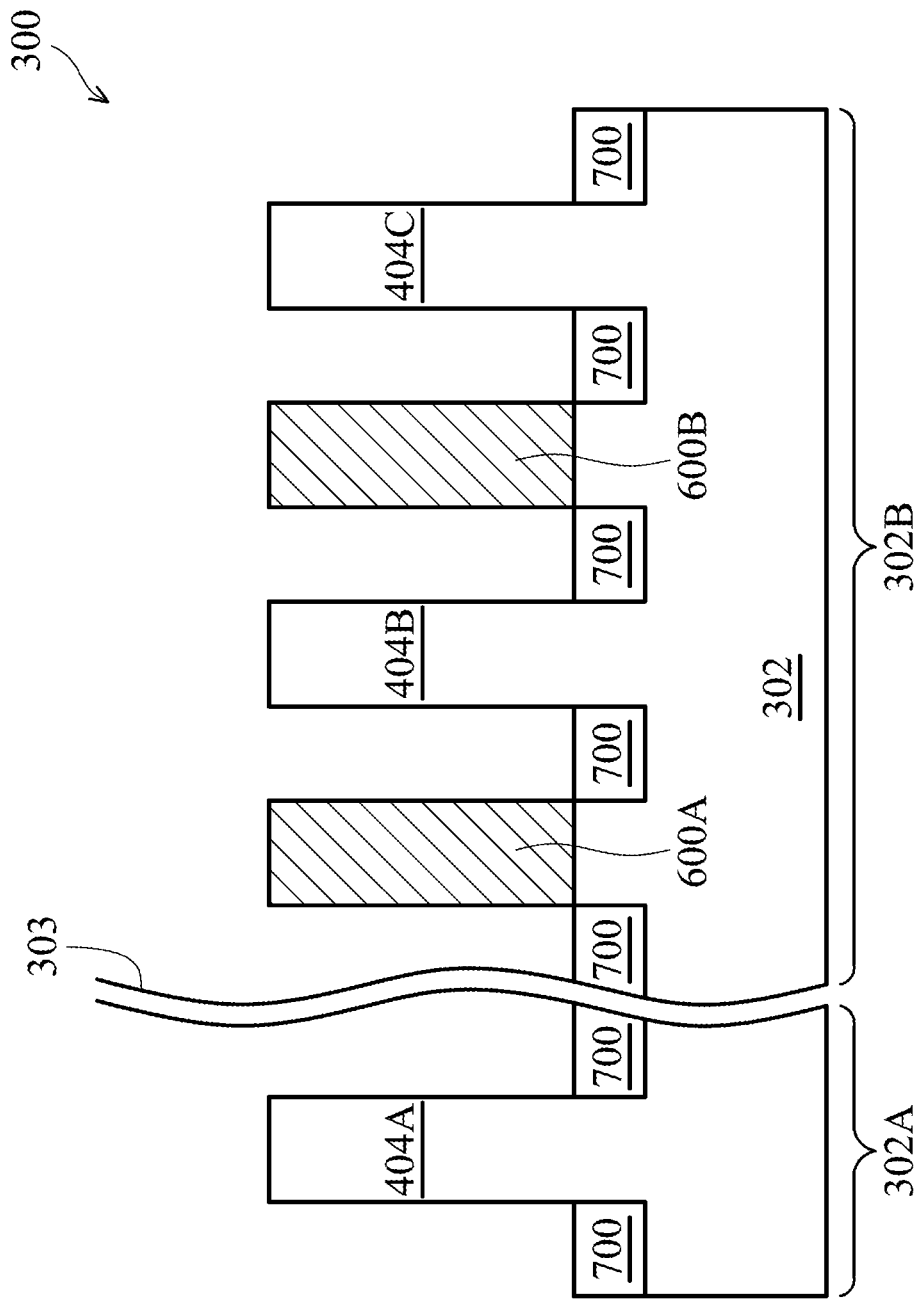

Corresponding to operation 208 of FIG. 2, FIG. 7 is a cross-sectional view of the FinFET device 300 including isolation regions 700 at one of the various stages of fabrication. The isolation regions 700, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 700 and a top surface of the fins 404A-C and 600A-B that are coplanar (not shown). The patterned mask 410 (FIG. 4) may also be removed by the planarization process.

In some embodiments, the isolation regions 700 include a liner, e.g., a liner oxide (not shown), at the interface between each of the isolation regions 700 and the substrate 302 (active fins 404A-C). In some embodiments, the liner oxide is formed to reduce crystalline defects at the interface between the substrate 302 and the isolation region 700. Similarly, the liner oxide may also be used to reduce crystalline defects at the interface between the active fins 404A-C and the isolation region 700. The liner oxide (e.g., silicon oxide) may be a thermal oxide formed through a thermal oxidation of a surface layer of the substrate 302, although other suitable method may also be used to form the liner oxide.

Next, the isolation regions 700 are recessed to form shallow trench isolation (STI) regions 700, as shown in FIG. 7. The isolation regions 700 are recessed such that the upper portions of the fins 404A-C and 600A-B protrude from between neighboring STI regions 700. Respective top surfaces of the STI regions 700 may have a flat surface (as illustrated), a convex surface, a concave surface (such as dishing), or combinations thereof. The top surfaces of the STI regions 700 may be formed flat, convex, and/or concave by an appropriate etch. The isolation regions 700 may be recessed using an acceptable etching process, such as one that is selective to the material of the isolation regions 700. For example, a dry etch or a wet etch using dilute hydrofluoric (DHF) acid may be performed to recess the isolation regions 700.

Figure 8:
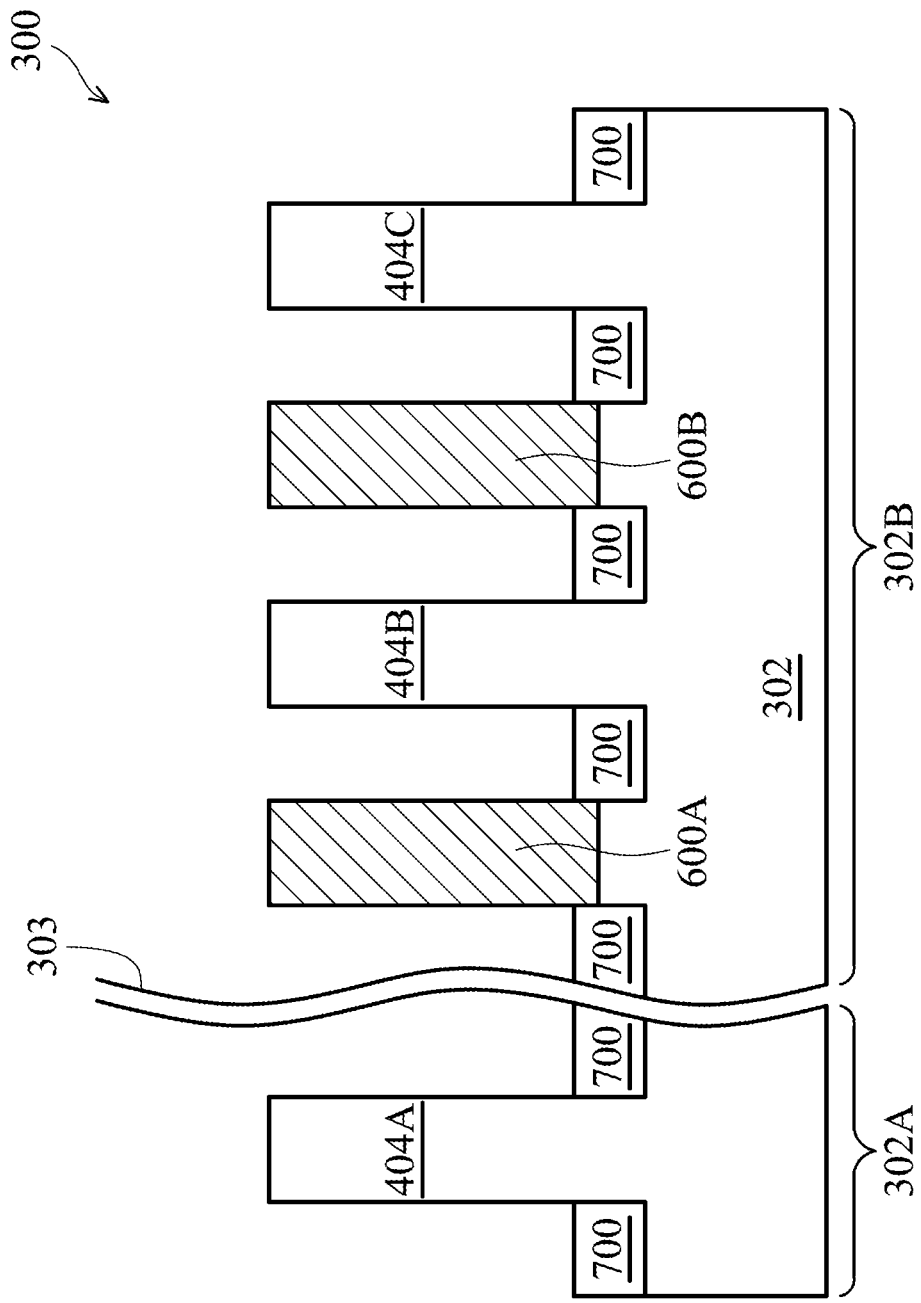

As mentioned above, the dummy fins 600A-B may be formed concurrently with or subsequently to the formation of the isolation regions 700. As an example, when forming the active fins 404A-C (FIG. 4), one or more other active fins may also be formed in the trenches 411. The insulation material of the isolation regions 700 may be deposited over the active fins, followed by a CMP process to planarize the top surfaces of the isolation regions 700 and the active fins, which include the active fins 404A-C and the active fins formed in the trenches 411. Subsequently, an upper portion of the active fins formed in the trenches 411 may be partially removed to form cavities. The cavities are then filled with the dielectric material of the dummy channel layer 500, followed by another CMP process to form the dummy fins 600A-B. The isolation regions 700 are recessed to form the shallow trench isolation (STI) regions 700, as shown in FIG. 8. Using such a method to form the dummy fins 600A-B, the dummy fins 600A-B are formed on the substrate 302 and a bottom surface of the dummy fins 600A-B is below the top surface of the isolation regions 700, as shown in FIG. 8. Depending on how much of the isolation regions 700 is recessed, the bottom surface of the dummy fins 600A-B may be above the top surface of the isolation regions 700, while remaining within the scope of the present disclosure.

Figure 9:
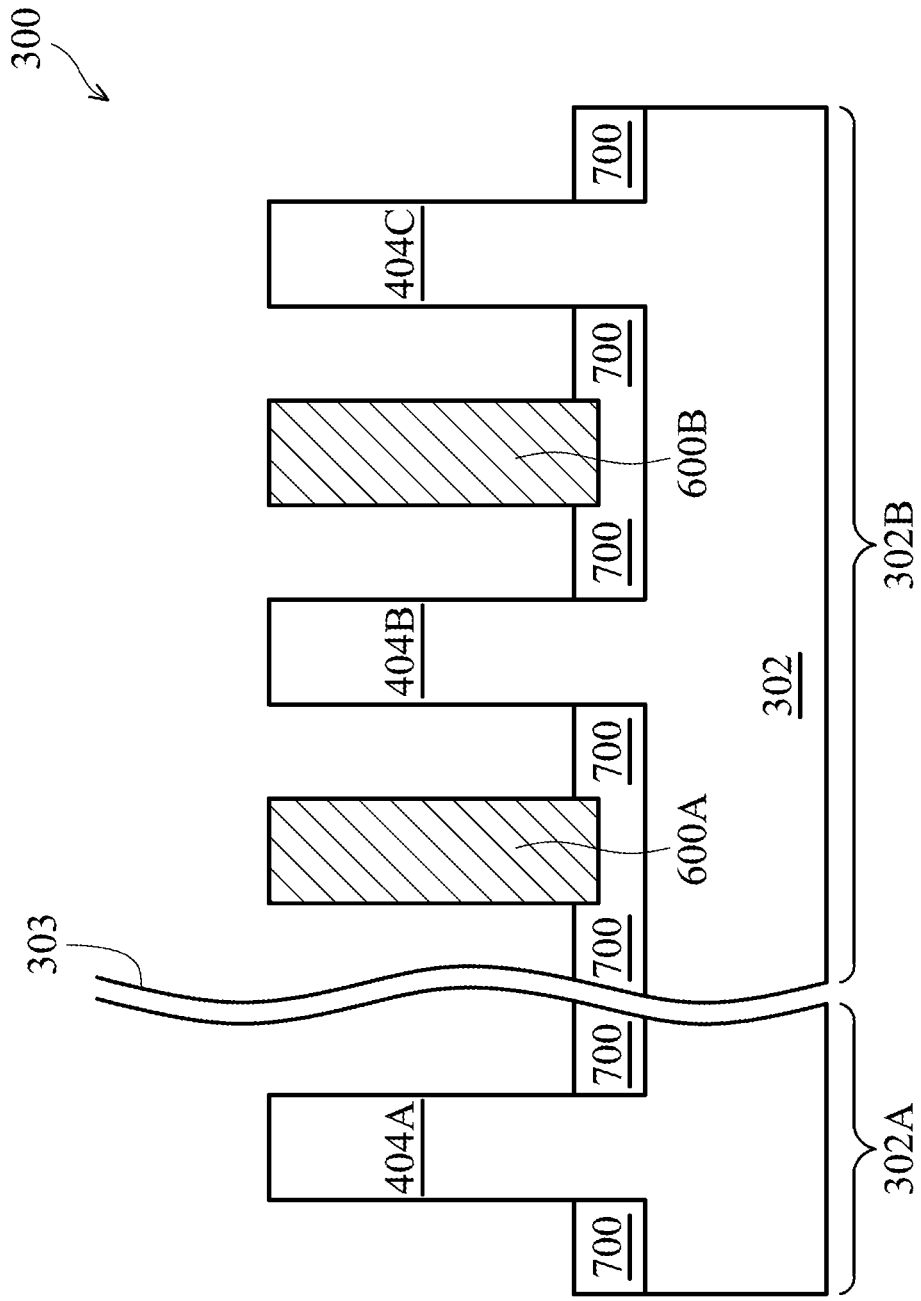

As another example, after forming the active fins 404A-C (FIG. 4), the insulation material of the isolation regions 700 may be deposited over the active fins 404A-C in a controlled deposition rate, thereby causing cavities to be spontaneously formed in the trenches 411. The cavities are then filled with the dielectric material of the dummy channel layer 500, followed by a CMP process to form the dummy fins 600A-B. The isolation regions 700 are recessed to form the shallow trench isolation (STI) regions 700, as shown in FIG. 9. Using such a method to form the dummy fins 600A-B, the dummy fins 600A-B are formed on the isolation regions 700 and a bottom surface of the dummy fins 600A-B is embedded in the corresponding isolation region 700, as shown in FIG. 9. As yet another example, after forming the active fins 404A-C (FIG. 4) and depositing the insulation material of the isolation regions 700 over the active fins 404A-C, a patterned mask may be formed over the isolation regions 700 to expose portions of the isolation regions 700 to form the dummy fins 600A-B (e.g., in the trenches 411). Subsequently, the exposed portions of the isolation regions 700 may be etched using, for example, reactive ion etch (RIE), neutral beam etch (NBE), the like, or combinations thereof, thereby defining cavities. The cavities are then filled with the dielectric material of the dummy channel layer 500, followed by a CMP process to form the dummy fins 600A-B, which is similar to the illustrated embodiment of FIG. 9.

Figure 10:
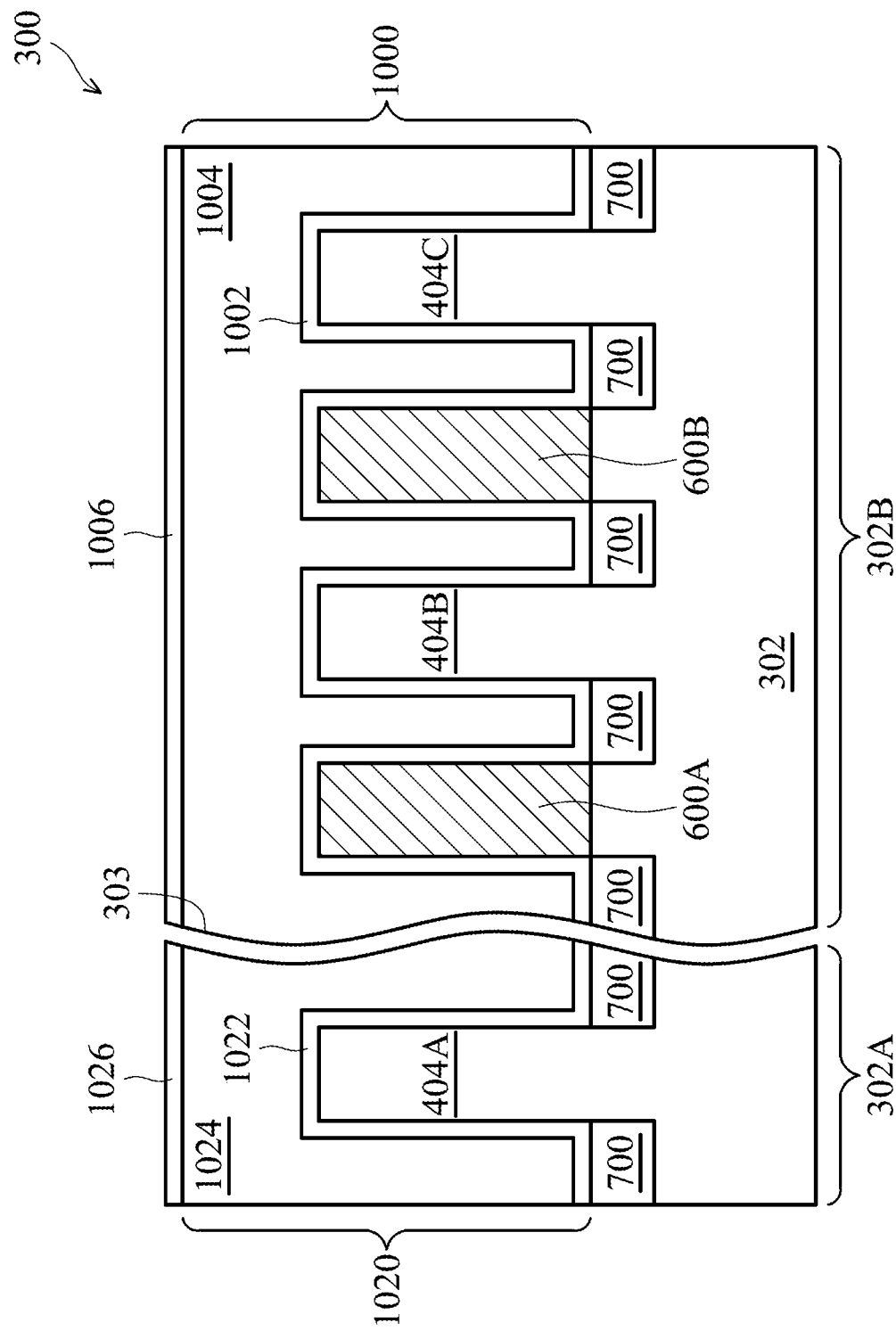

Corresponding to operation 210 of FIG. 2, FIG. 10 is a cross-sectional view of the FinFET device 300 including a dummy gate structure 1000 in the core area 302B at one of the various stages of fabrication. The dummy gate structure 1000 is formed to overlay a respective portion of each of the fins (e.g., active fins 400B-C, dummy fins 600A-B) in the core area 302B. Prior to, concurrently with, or subsequently to forming the dummy gate structure 1000 in the core area 302B, a dummy gate structure 1020 may be formed in the I/O area 302A to overlay a portion of the active fin 404A. The dummy gate structure 1020 is similar to the dummy gate structure 1000, except for its dimensions, and thus, the dummy gate structure 1020 will be briefly discussed below.

The dummy gate structure 1000 includes a dummy gate dielectric 1002 and a dummy gate 1004, in some embodiments. A mask 1006 may be formed over the dummy gate structure 1000. To form the dummy gate structure 1000, a dielectric layer is formed on the active fins 404B-C and dummy fins 600A-B. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown. Similarly, the dummy gate structure 1020 includes a dummy gate dielectric 1022 and a dummy gate 1024, with a mask 1026 formed thereon.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 1006 (1026). The pattern of the mask 1006 (1026) then may be transferred to the gate layer and the dielectric layer by a suitable etching technique to form the dummy gate 1004 (1024) and the underlying dummy gate dielectric 1002 (1022), respectively. The dummy gate 1004 and the dummy gate dielectric 1002 cover a respective central portion (e.g., a channel region) of each of the active fins 404B-C and the dummy fins 600A-B; and the dummy gate 1024 and the dummy gate dielectric 1022 cover a central portion (e.g., a channel region) of the active fin 404A. The dummy gate 1004 (1024) may also have a lengthwise direction (e.g., direction B-B of FIG. 1) perpendicular to the lengthwise direction (e.g., direction of A-A of FIG. 1) of the fins.

The dummy gate dielectric 1002 is shown to be formed over the active fins 404B-C and the dummy fins 600A-B (e.g., over the respective top surfaces and the sidewalls of the fins) and over the STI regions 700 in the example of FIG. 10. Similarly, the dummy gate dielectric 1022 is formed to overlay the active fin 404A, e.g., overlaying a top surface and sidewalls of the active fin 404A. In other embodiments, the dummy gate dielectric 1002 (1022) may be formed by, e.g., thermal oxidization of a material of the fins, and therefore, may be formed over the fins but not over the STI regions 700. It should be appreciated that these and other variations are still included within the scope of the present disclosure.

FIGS. 11-13 illustrate the cross-sectional views of further processing (or making) of the FinFET device 300 along cross-section A-A of one of the active fins 404A-C (as indicated in FIG. 1). As a representative example, two dummy gate structures 1000A and 1000B are illustrated over the active fin 404B in FIGS. 11-13. For simplicity, the dummy gate structures 1000A-B may sometimes be collectively referred to as dummy gate structures 1000. It should be appreciated that more or less than two dummy gate structures can be formed over the fin 404B (and each of the other fins, e.g., 404A, 404C, 600A-B), while remaining within the scope of the present disclosure.

Corresponding to operation 212 of FIG. 2, FIG. 11 is a cross-sectional view of the FinFET device 300 including gate spacer 1100 formed around (e.g., along and contacting the sidewalls of) the dummy gate structures 1000. For example, the gate spacer 1100 may be formed on opposing sidewalls of the dummy gate structure 1000. It should be understood that any number of gate spacers can be formed around the dummy gate structures 1000 while remaining within the scope of the present disclosure.

The gate spacer 1100 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1100. The shapes and formation methods of the gate spacer 1100 as illustrated in FIG. 11 are merely non-limiting examples, and other shapes and formation methods are possible. These and other variations are fully intended to be included within the scope of the present disclosure.

Corresponding to operation 214 of FIG. 2, FIG. 12 is a cross-sectional view of the FinFET device 300 including a number of source/drain regions 1200 at one of the various stages of fabrication. The source/drain regions 1200 are formed in recesses of the active fin 404B adjacent to the dummy gate structures 1000, e.g., between adjacent dummy gate structures 1000 and/or next to a dummy gate structure 1000. The recesses are formed by, e.g., an anisotropic etching process using the dummy gate structures 1000 as an etching mask, in some embodiments, although any other suitable etching process may also be used.

The source/drain regions 1200 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 12, the epitaxial source/drain regions 1200 may have surfaces raised from respective surfaces of the active fin 404B (e.g. raised above the non-recessed portions of the active fin 404B) and may have facets. In some embodiments, the source/drain regions 1200 of the adjacent fins may merge to form a continuous epitaxial source/drain region (not shown). In some embodiments, the source/drain regions 1200 of the adjacent fins may not merge together and remain separate source/drain regions 1200 (not shown). In some embodiments, when the resulting FinFET device is an n-type FinFET, the source/drain regions 1200 can include silicon carbide (SiC), silicon phosphorous (SiP), phosphorous-doped silicon carbon (SiCP), or the like. In some embodiments, when the resulting FinFET device is a p-type FinFET, the source/drain regions 1200 comprise SiGe, and a p-type impurity such as boron or indium.

The epitaxial source/drain regions 1200 may be implanted with dopants to form source/drain regions 1200 followed by an annealing process. The implanting process may include forming and patterning masks such as a photoresist to cover the regions of the FinFET device 300 that are to be protected from the implanting process. The source/drain regions 1200 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the source/drain regions 1200 of a P-type transistor. N-type impurities, such as phosphorous or arsenide, may be implanted in the source/drain regions 1200 of an N-type transistor. In some embodiments, the epitaxial source/drain regions 1200 may be in situ doped during their growth.

Corresponding to operation 216 of FIG. 2, FIG. 13 is a cross-sectional view of the FinFET device 300 including an interlayer dielectric (ILD) 1300 at one of the various stages of fabrication. In some embodiments, prior to forming the ILD 1300, a contact etch stop layer (CESL) 1302 is formed over the structure, as illustrated in FIG. 13. The CESL 1302 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1300 is formed over the CESL 1302 and over the dummy gate structures 1000. In some embodiments, the ILD 1300 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1300 is formed, an optional dielectric layer 1304 is formed over the ILD 1300. The dielectric layer 1304 can function as a protection layer to prevent or reduces the loss of the ILD 1300 in subsequent etching processes. The dielectric layer 1304 may be formed of a suitable material, such as silicon nitride, silicon carbonitride, or the like, using a suitable method such as CVD, PECVD, or FCVD. After the dielectric layer 1304 is formed, a planarization process, such as a CMP process, may be performed to achieve a level upper surface for the dielectric layer 1304. The CMP may also remove the mask 1006 and portions of the CESL 1302 disposed over the dummy gate 1004 (FIG. 12). After the planarization process, the upper surface of the dielectric layer 1304 is level with the upper surface of the dummy gate 1004, in some embodiments.

An example gate-last process (sometimes referred to as replacement gate process) can then be performed to replace the dummy gate 1004 and selectively, a portion of the dummy gate dielectric 1002 of each of the dummy gate structures 1000 in the core area 302B with an active gate (which may also be referred to as a replacement gate or a metal gate layer). Similarly, in the I/O area 302A, the dummy gate 1024 may be replaced with a corresponding active gate or metal gate layer. FIGS. 14-20 illustrate the cross-sectional views of further processing (or making) of the FinFET device 300 along cross-section B-B of one of the dummy gate structures 1000 (1020) (as indicated in FIG. 1).

Figure 14:
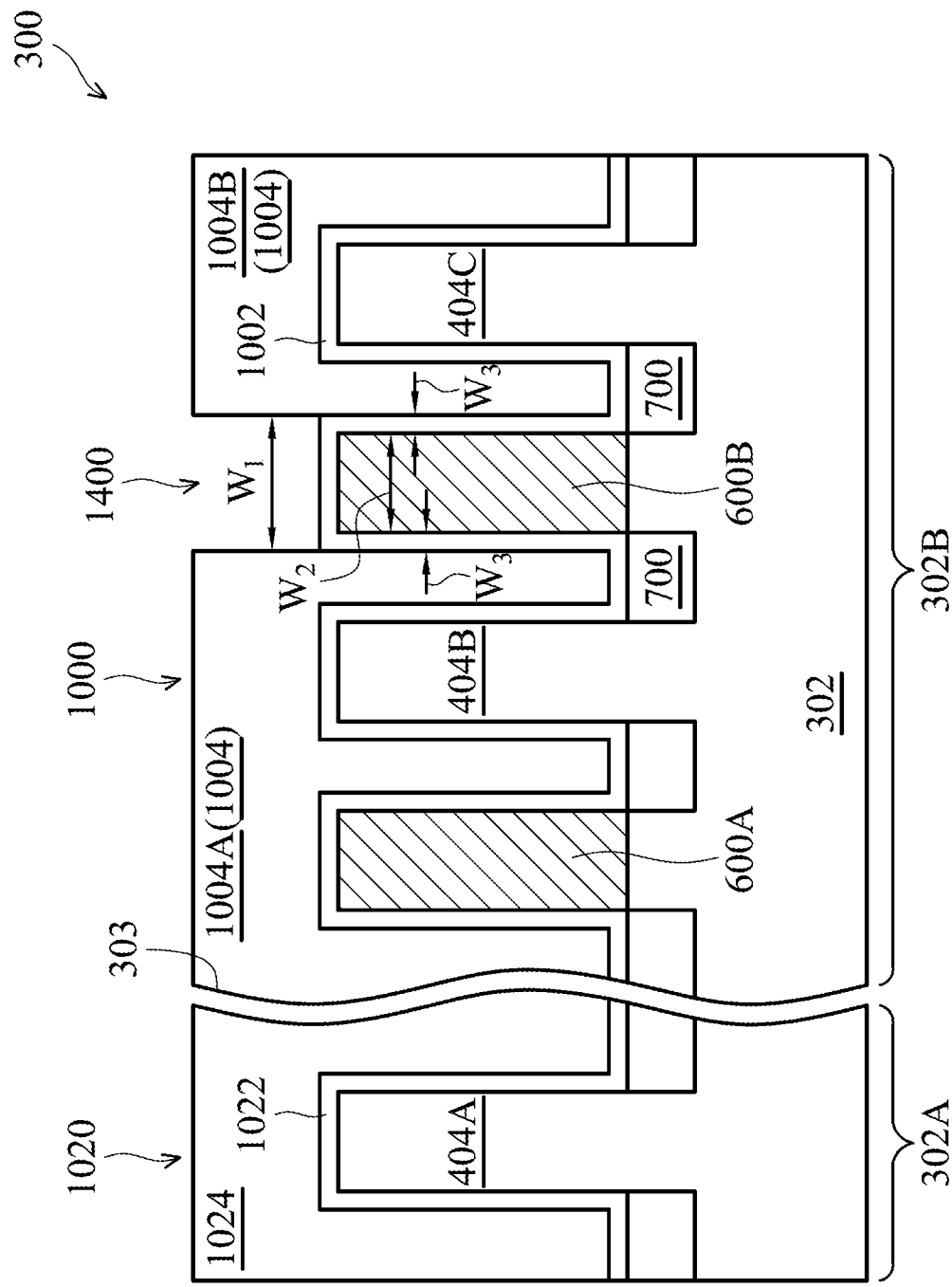

Corresponding to operation 218 of FIG. 2, FIG. 14 is a cross-sectional view of the FinFET device 300 in which the dummy gate structure 1000 is cut, intercepted, or otherwise disconnected to form a cavity 1400 at one of the various stages of fabrication. The cavity 1400 is formed by removing a portion of the dummy gate 1004 of the dummy gate structure 1000 that is disposed above one of the dummy fins to be overlaid by a gate isolation structure, e.g., dummy fin 600B. When forming the cavity 1400, the dummy gate dielectric 1002 may remain universally intact over the active fins 404B-C and dummy fins 600A-B. Upon the cavity 1400 being formed, the dummy gate 1004 is cut into two separate (isolated) dummy gates, which are herein referred to as dummy gate portions 1004A and 1004B, respectively. In some embodiments, when removing the portion of the dummy gate 1004 to form the cavity 1400, the gate spacer 1100 extended along the sidewalls of the dummy gate structure 1000 (FIGS. 11-13) may remain intact.

To form the cavity 1400, a mask may be formed over the dummy gate structure 1000 to expose the portion of the dummy gate 1000 desired to be removed (e.g., the portion disposed over the dummy fin 600B), followed by one or more isotropic etching processes to remove the portion of the dummy gate 1000. During the removal of the dummy gate, the dummy gate dielectric 1002 may be used as an etch stop layer when the dummy gate 1004 is etched. As such, the dummy gate dielectric 1002 may remain universally intact over the active fins 404B-C and dummy fins 600A-B. The isotropic etching process is performed using an etchant that is selective to (e.g., having a higher etching rate for) the material of the dummy gate 1004, such that the exposed portion of the dummy gate 1004 is removed without attacking the underlying dummy gate 1002.

In some embodiments, the cavity 1400 may be formed to have a width (along cross-section B-B as indicated in FIG. 1), $W_1$, which is approximately similar to the sum of a width of the dummy fin 600B, $W_2$, and two times a thickness of the dummy gate dielectric, $W_3$. For example, a ratio of $W_1$ to $W_2+2 \times W_3$ may range from about 0.7 to about 1.3. When the ratio is too large, subsequent process windows may be adversely impacted (e.g., the process window to form a metal gate layer over the adjacent active fins 404B and 404C); and when the ratio is too small, a gate isolation structure to be formed in the cavity 1400 may not reach the desired function to electrically isolate a metal gate layer over the active fins 404B and 404C. Although the cavity 1400 is shown to have inner sidewalls that are perpendicular to a top surface of the dummy gate dielectric 1002, it should be understood that the inner sidewalls may be tilted away from such a perpendicular direction while remaining within the scope of the present disclosure. As such, the cavity 1400 may have an upper portion that is laterally wider or narrower than its lower portion, for example.

Figure 15:
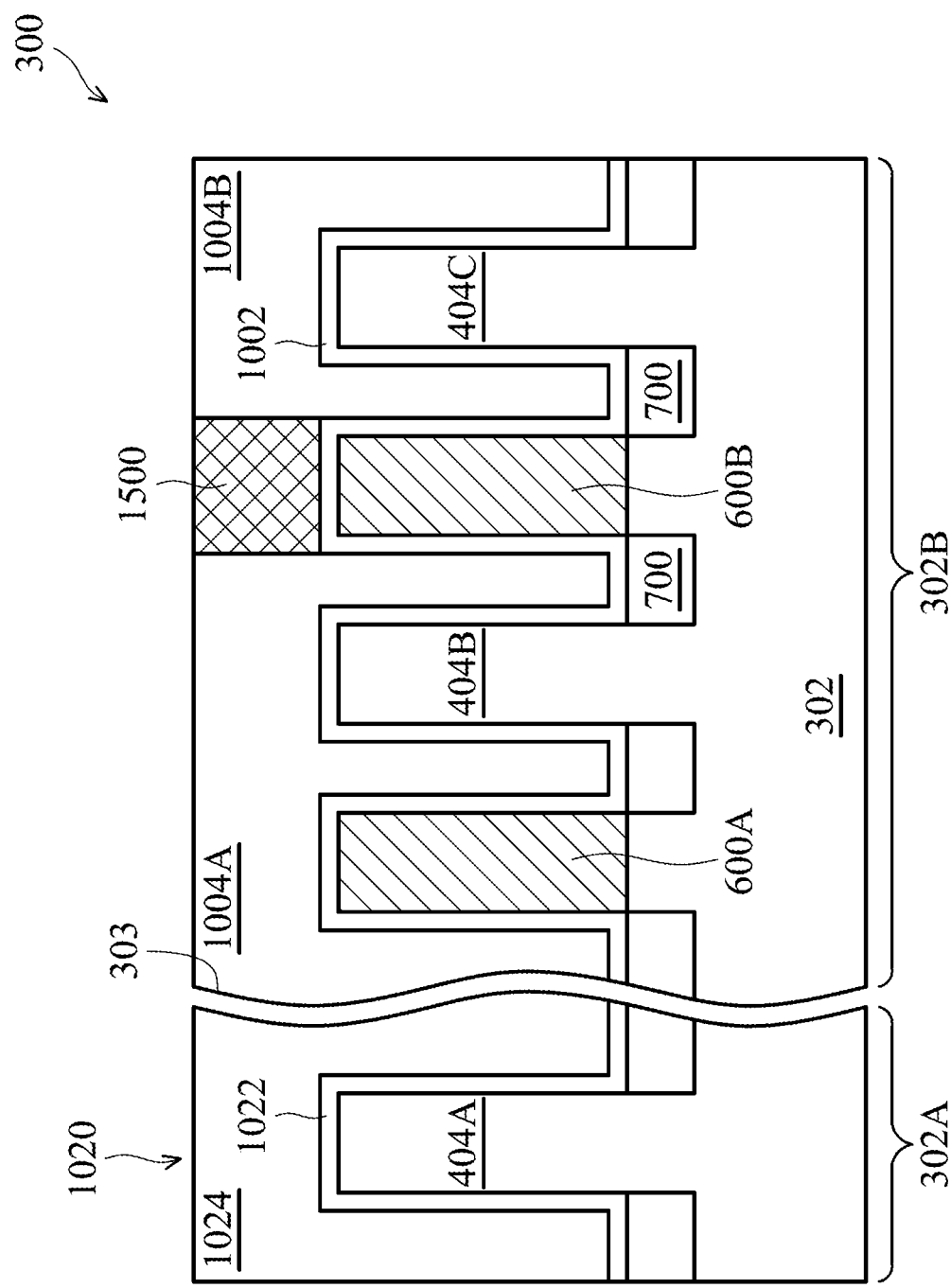

Corresponding to operation 220 of FIG. 2, FIG. 15 is a cross-sectional view of the FinFET device 300 including a gate isolation structure 1500 at one of the various stages of fabrication. The gate isolation structure 1500 includes a dielectric material. The dielectric material may be, for example, silicon oxide, silicon nitride, silicon oxynitride, silicon carbide, silicon carbonitride, silicon oxycarbonitride, silicon oxycarbide, multilayers thereof, or the like. The gate isolation structure 1500 can be formed by depositing the dielectric material in the cavity 1400 using any suitable method, such as CVD, PECVD, or FCVD. After the deposition, a CMP may be performed to remove any excess dielectric material from the remaining dummy gate portions 1004A-B. In some embodiments, the gate isolation structure 1500 can inherit the dimension of the cavity 1400, i.e., having the same width $W_1$ (along cross-section B-B as indicated in FIG. 1).

Figure 16:
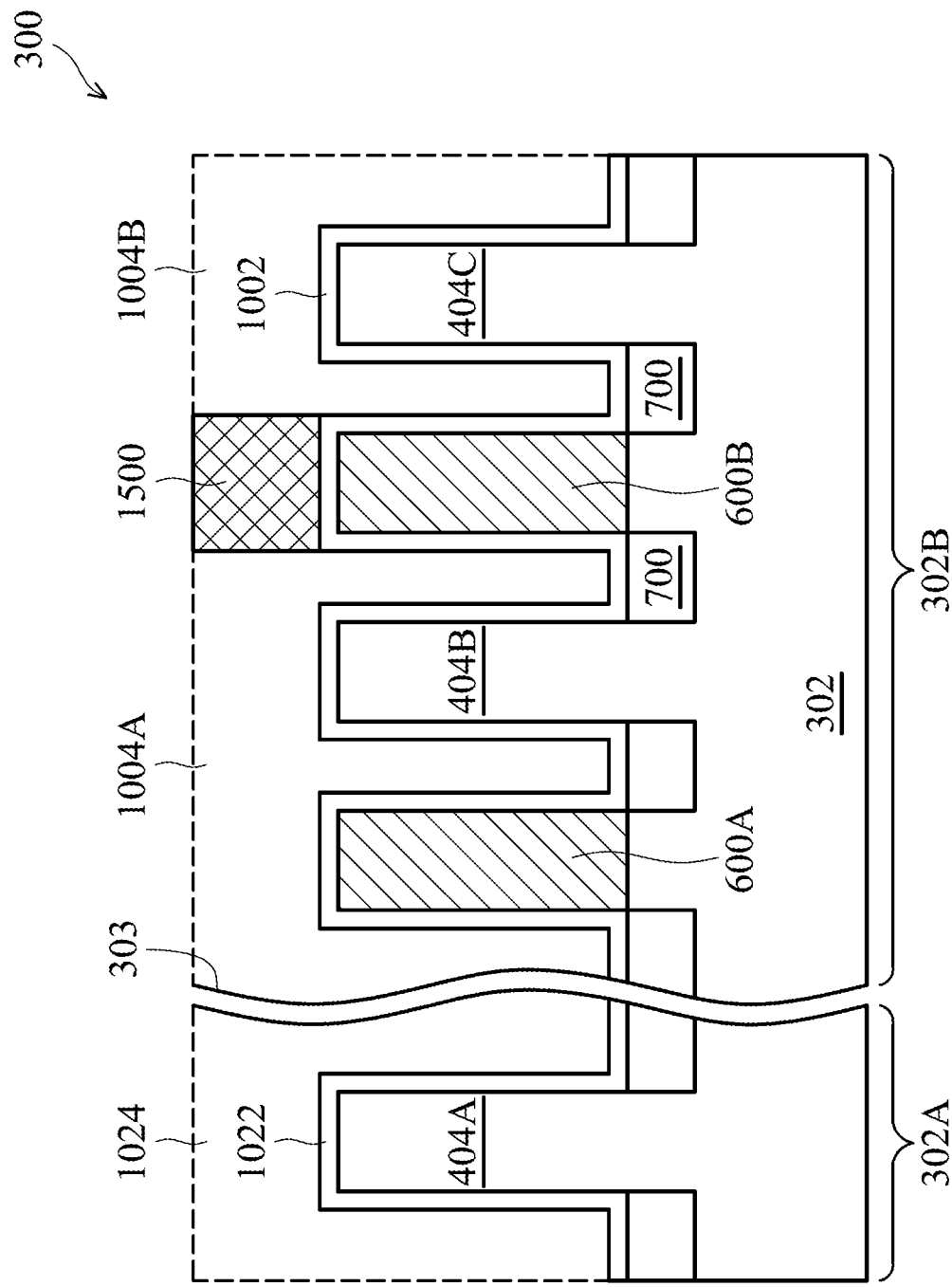

Corresponding to operation 222 of FIG. 2, FIG. 16 is a cross-sectional view of the FinFET device 300 in which the remaining dummy gate portions 1004A-B (shown in dotted line in FIG. 16) are removed at one of the various stages of fabrication. In some embodiments, the dummy gate 1024 (also shown in dotted line in FIG. 16) overlaying the active fin 404A may be concurrently removed. To remove the dummy gate portions 1004A-B (and the dummy gate 1024), one or more isotropic etching processes may be performed. During the removal of the dummy gate portions 1004A-B (and the dummy gate 1024), the dummy gate dielectric 1002 (1022) may be again used as an etch stop layer when the dummy gate portions 1004A-B are etched. The isotropic etching process is performed using an etchant that is selective to (e.g., having a higher etching rate for) the material of the dummy gate material, such that the dummy gate portions 1004A-B (and the dummy gate 1024) are removed without attacking the underlying dummy gate material 1002 (1022).

Figure 17:
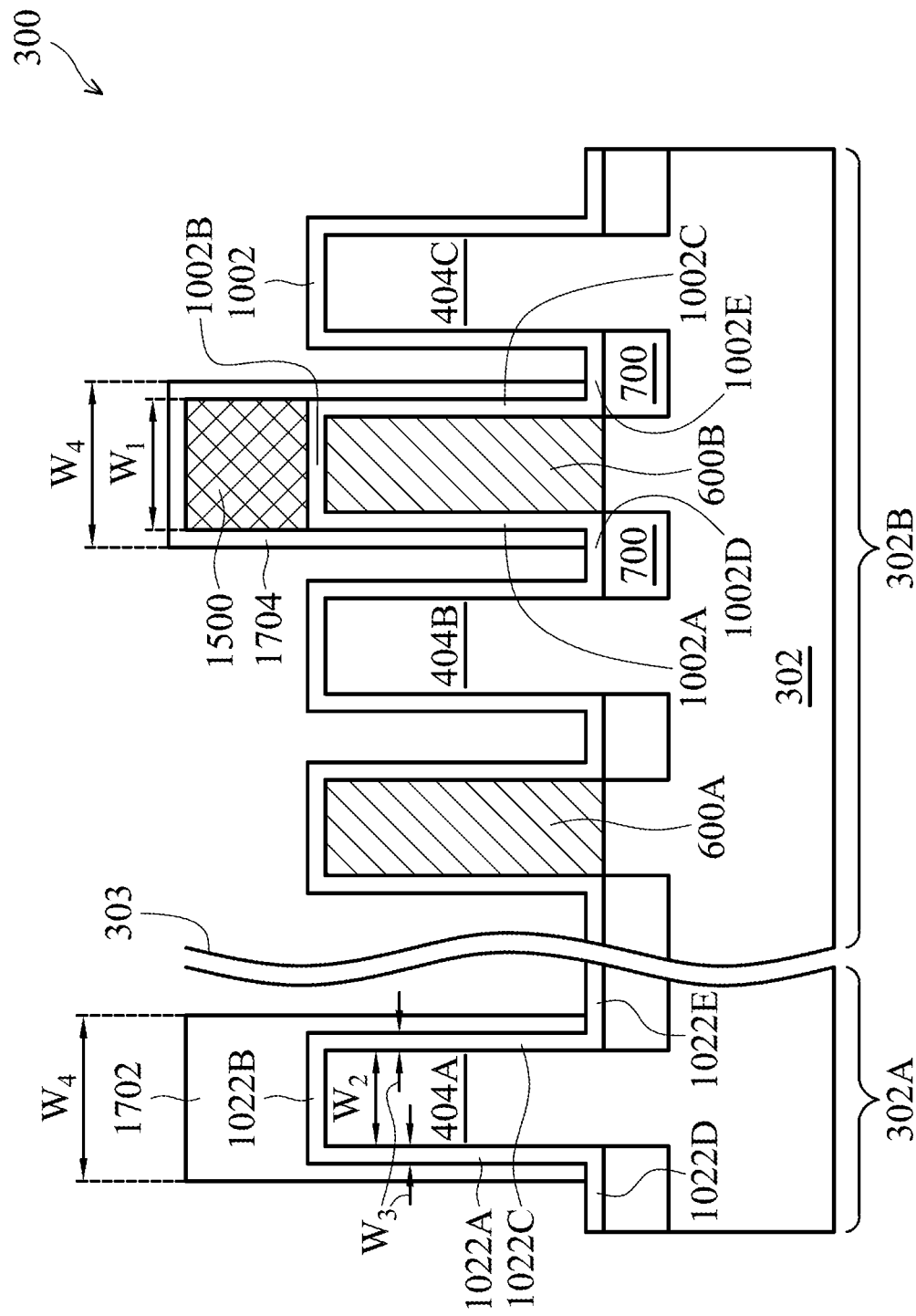

Corresponding to operation 224 of FIG. 2, FIG. 17 is a cross-sectional view of the FinFET device 300 including one or more masks, 1702 and 1704, selectively covering active fin 404A in the I/O area 302A and the dummy fin 600B in the core area 302B at one of the various stages of fabrication. The masks 1702 and 1704 may each include a patternable layer such as, for example, a photoresist (PR) layer. As shown in the example of FIG. 17, the mask 1702 is selected to cover an active fin that is disposed in the I/O area 302A of the substrate 302, for example, the active fin 404A. In some embodiments, the mask 1704 is selected to cover a dummy fin in the core area 302B that is overlaid by a gate isolation structure, for example, the dummy core fin 600B. Each of the masks 1702-1704 may be configured to cover (or otherwise overlay) a portion or the whole of the corresponding fin, which will be shown in FIGS. 21-24.

By covering a fin with the mask 1702-1704, a corresponding portion of the dummy gate dielectric 1002 that is around the fin (e.g., the portion that is disposed above the top surface of the fin and extended along the sidewalls of the fin) may be protected from being removed in a subsequent process of removing the dummy gate dielectric 1002. As illustrated in FIG. 17, the mask 1702 overlays at least dummy gate dielectric portion 1022A that is extended along one of the sidewalls of the active fin 404A, dummy gate dielectric portion 1022B that is disposed over the top surface of the active fin 404A, and dummy gate dielectric portion 1022C that is extended along the other of the sidewalls of the active fin 404A. Additionally, the mask 1702 can overlay dummy gate dielectric portions 1022D and 1022E that are laterally extended from portions 1022A and 1022C, respectively, to the isolation regions 700. The mask 1704 overlays at least dummy gate dielectric portion 1002A that is extended along one of the sidewalls of the dummy fin 600B, dummy gate dielectric portion 1002B that is disposed over the top surface of the dummy fin 600B, and dummy gate dielectric portion 1002C that is extended along the other of the sidewalls of the dummy fin 600B. Additionally, the mask 1704 can overlay dummy gate dielectric portions 1002D and 1002E that are laterally extended from portions 1002A and 1002C, respectively, to the isolation regions 700.

In some embodiments, the masks 1702-1704 may be formed to have a width, $W_4$ (along cross-section B-B as indicated in FIG. 1). As shown, the width $W_4$ is selected to be slightly greater than the width of a gate isolation structure (if any), $W_1$, or the sum of the width of an overlaid fin and two times the width of a dummy gate dielectric, $W_2+2 \times W_3$. A ratio of $W_4$ to $W_1$ or $W_2+2 \times W_3$ may range from 1 to 1.5. However, it is understood that the ratio may vary in accordance with the density of transistors formed in the corresponding area. For example, as the mask 1704 is formed over the dummy 600B that is disposed in the core area 302B where the density of transistors is relatively higher, the ratio may be selected to be close to 1. As such, the lateral distance by which the portions 1002D and 1002E are extended from the portions 1002A and 1002C, respectively, may be close to 0. In another example, as the mask 1702 is formed over the active fin 404A that is disposed in the I/O area 302A where the density of transistors is relatively lower, the ratio may be selected to be greater than 1 (e.g., 1.5). As such, the lateral distance by which the portions 1022D and 1022E are extended from the portions 1022A and 1022C, respectively, may be about a half of $0.5 \times W_4$.

Figure 18:
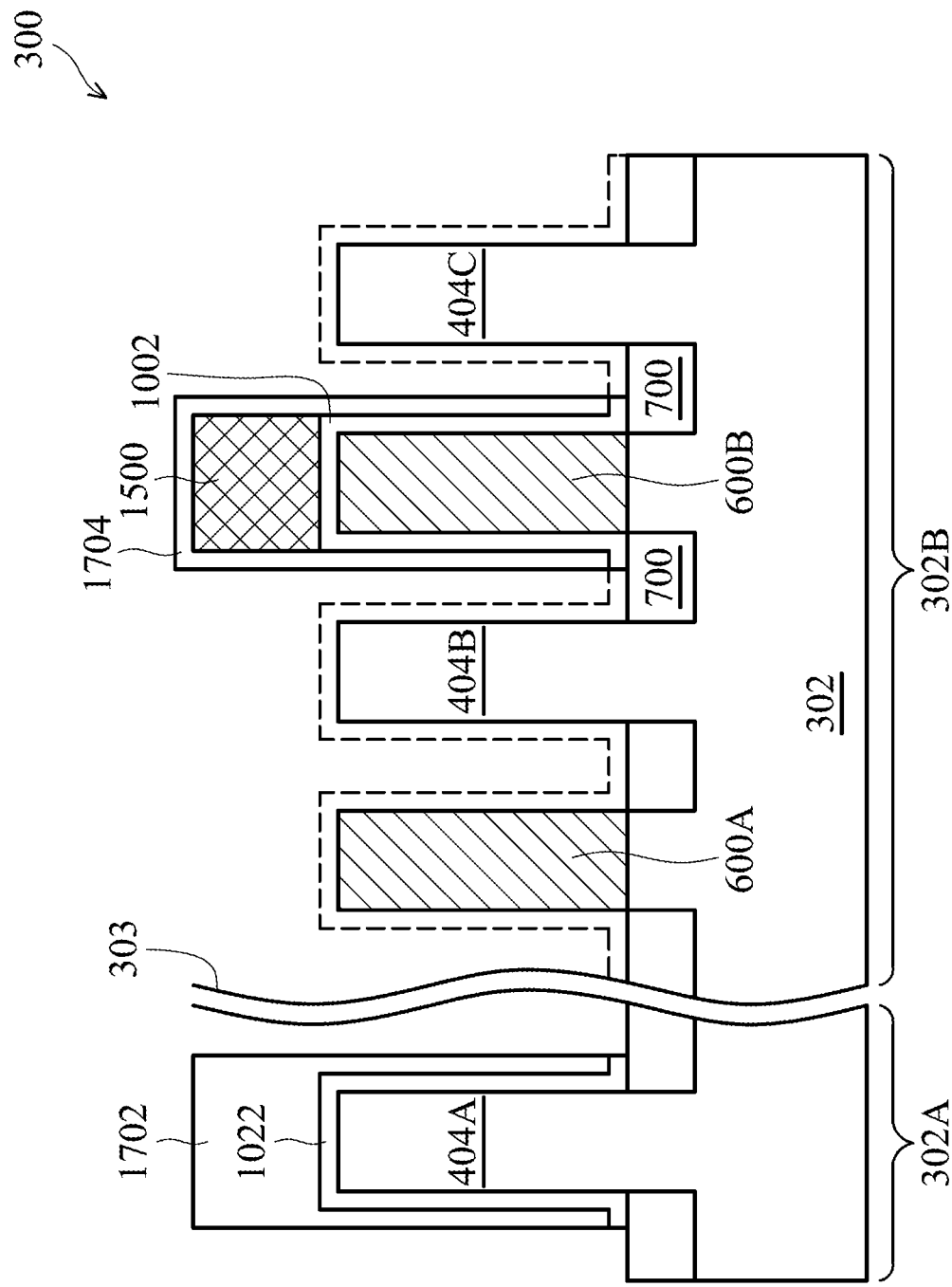

Corresponding to operation 226 of FIG. 2, FIG. 18 is a cross-sectional view of the FinFET device 300 in which unmasked portions of the dummy gate dielectrics 1002 and 1022 that are not covered by the masks 1702 and 1704 are removed and masked portions of the dummy gate dielectrics 1002 and 1022 remain at one of the various stages of fabrication. In the illustrated embodiment of FIG. 18, such unmasked portions of the dummy gate dielectric 1002 include at least the portions of the dummy gate dielectric 1002 that are extended along the sidewalls of the dummy fin 600B, disposed on the top surface of the dummy fin 600B, extended along the sidewalls of the active fin 404B, disposed on the top surface of the active fin 404B, extended along the sidewalls of the active fin 404C, and disposed on the top surface of the active fin 404C, respectively (as shown in dotted line of FIG. 18).

Upon the unmasked portions of the dummy gate dielectric 1002 being removed, the overlaid (e.g., central) portion of the corresponding fin may be exposed. For example, the respective central portions of the dummy fin 600A and the active fins 404B and 404C may be exposed. In some embodiments, such an exposed fin may have a native oxide layer formed around its surface. The native oxide layer may have a relatively thin thickness of about 3-5 angstroms (Å). In some embodiments, when removing the unmasked portion of the dummy gate dielectric 1002, the gate spacer 1100 (FIGS. 11-13) that are not covered by the masks 1702-1704 may not remain intact and thus have a narrower width, which will be discussed in further detail below with respect to FIGS. 21-24.

Figure 19:
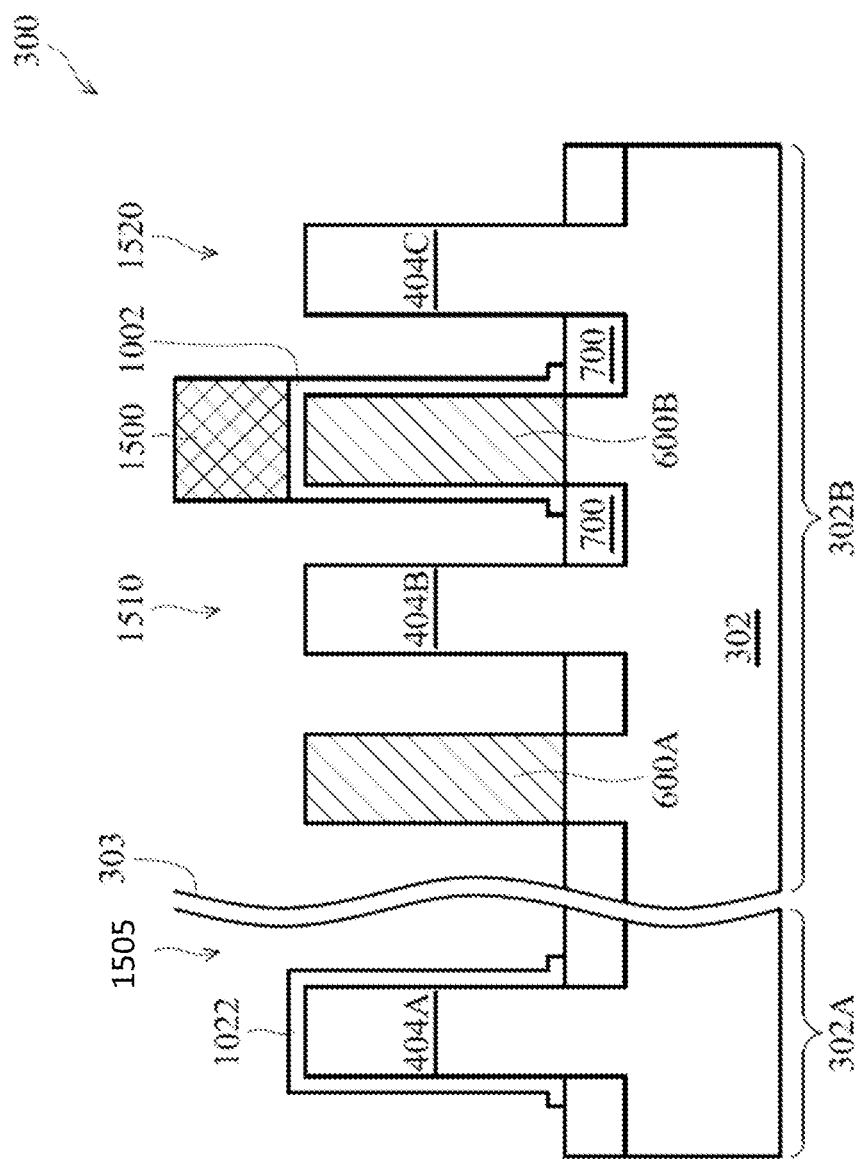
Figure 20:
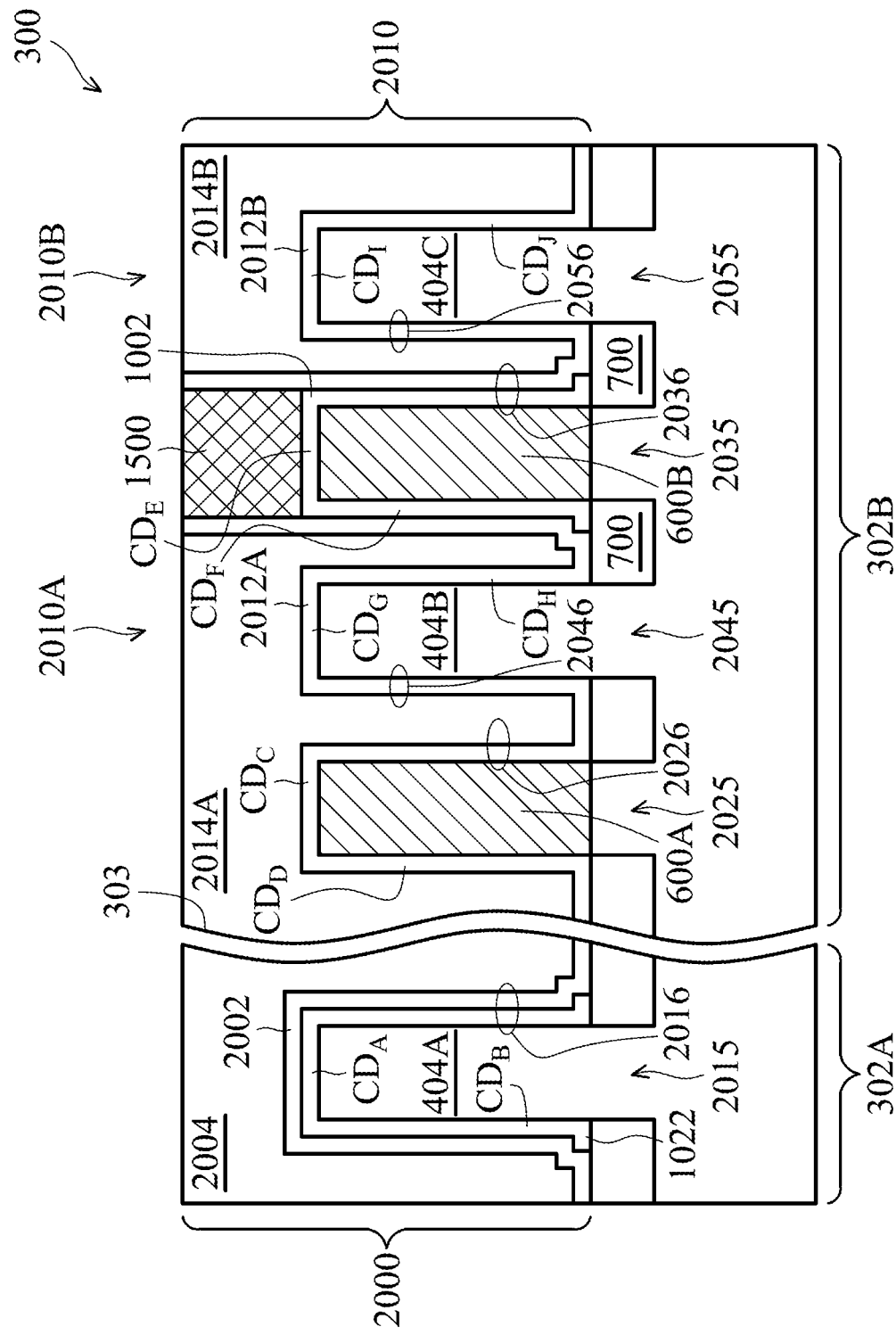

Corresponding to operation 228 of FIG. 2, FIG. 19 is a cross-sectional view of the FinFET device 300 in which the masks 1702-1704 (FIG. 18) are removed at one of the various stages of fabrication, and FIG. 20 is a cross-sectional view of the FinFET device 300 includes gate features 2000 and 2010. The masks 1702-1704 may be removed by an ashing process (e.g., an oxygen-based plasma process).

Referring first to FIG. 19, upon the masks 1702-1704 being removed, gate trench 1505 in the I/O area 302A, and gate trenches 1510 and 1520 in the core area 302B are formed. As shown, the gate trenches 1510 and 1520 are separated by the gate isolation structure 1500. Referring then to FIG. 20, upon the gate trenches 1505-1520 being formed, the gate feature 2000 is formed in the trench 1505 and the gate feature 2010 is formed in the gate trenches 1510 and 1520. As shown, in the I/O area 302A, the gate feature 2000 may overlay the active fin 404A. And in the core area 302B, the gate feature 2010 may include two portions 2010A and 2010B that are separated by the gate isolation structure 1500. The portion 2010A can overlay the dummy fin 600A and the active fin 404B, and the portion 2010B can overlay the active fin 404C.

The gate feature 2010 can include a gate dielectric layer 2012, a metal gate layer 2014, and one or more other layers that are not shown for clarity. Similarly, the gate feature 2000 can include a gate dielectric layer 2002, a metal gate layer 2004, and one or more other layers that are not shown for clarity. For example, each of the gate features 2000 and 2010 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layer 2012 (2002) is deposited (e.g., conformally) in the corresponding gate trench to surround (e.g., straddle) one or more fins. For example, the gate dielectric layer 2012 of the portion 2010A is deposited in the gate trench 1510 (FIG. 19), sometimes referred to as "gate dielectric layer 2012A." The gate dielectric layer 2012A can overlay the top surfaces and the sidewalls of the dummy fin 600A, the top surfaces and the sidewalls of the active fin 404B, and one of the sidewalls of the dummy fin 600B with the remaining dummy gate dielectric 1002 disposed therebetween. The gate dielectric layer 2012 of the portion 2010B is deposited in the gate trench 1520 (FIG. 19), sometimes referred to as "gate dielectric layer 2012B." The gate dielectric layer 2012B can overlay the top surfaces and the sidewalls of the active fin 404C, and the other of the sidewalls of the dummy fin 600B with the remaining dummy gate dielectric 1002 disposed therebetween. The gate dielectric layer 2002 of the gate feature 2000, deposited in the gate trench 1505 (FIG. 19), can overlay the top surfaces and the sidewalls of the active fin 404A, with the remaining dummy gate dielectric 1022 disposed therebetween.

In accordance with some embodiments, the gate dielectric layer 2012A/B (2002) includes silicon oxide, silicon nitride, or multilayers thereof. In example embodiments, the gate dielectric layer 2012A/B (2002) includes a high-k dielectric material, and in these embodiments, the gate dielectric layers 2012A/B (2002) may have a k value greater than about 7.0, and may include a metal oxide or a silicate of Hf, Al, Zr, La, Mg, Ba, Ti, Pb, and combinations thereof. The formation methods of gate dielectric layer 2012 (2002) may include molecular beam deposition (MBD), atomic layer deposition (ALD), PECVD, and the like. A thickness of the gate dielectric layer 2012A/B (2002) may be between about 8 angstroms (Å) and about 20 angstroms, as an example.

The metal gate layer 2014 is formed over the gate dielectric layer 2012. The metal gate layer 2014 of the portion 2010A is deposited in the gate trench 1510 (FIG. 19), sometimes referred to as "metal gate layer 2014A;" and the metal gate layer 2014 of the portion 2010B is deposited in the gate trench 1520 (FIG. 19), sometimes referred to as "metal gate layer 2014B." Similarly, the metal gate layer 2004 is formed over the gate dielectric layer 2002. The metal gate layer 2014 (2004) may be a P-type work function layer, an N-type work function layer, multilayers thereof, or combinations thereof, in some embodiments. Accordingly, the metal gate layer 2014 (2004) is sometimes referred to as a work function layer. For example, the metal gate layer 2014 (2004) may be an N-type work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

By masking the dummy gate dielectric 1002 around the dummy fin 600B, the function of the gate isolation structure 1500, i.e., electrically isolating the metal gate layers 2014A and 2014B, can be assured. Such a "masked" dummy gate dielectric 1002 can assure no void exists between the gate isolation structure 1500 and the dummy fin 600B, when forming the metal gate layers 2014A and 2014B. As such, a merge of these two metal gate layers 2014A and 2014B (e.g., below the gate isolation structure 1500) can be advantageously avoided. Accordingly, the gate isolation structure 1500 can remain electrically isolating the metal layers (or gate features) respectively disposed on its two sides.

After the gate features 2010 and 2000 are formed, the FinFET device 300 can include a number of transistors, some of which can be active transistors and some of which can be dummy transistors. For example in the I/O area 302A, an active transistor 2015, adopting the active fin 404A as its conduction channel, may be formed. In addition to the gate dielectric layer 2002, the active transistor 2015 includes the remaining portion of the dummy gate dielectric 1022 over the fin 404A as part of its gate dielectric 2016. The active transistor 2015, with such a relatively thick gate dielectric 2016, can be configured as an I/O transistor. Through the relatively thick gate dielectric 2016, the metal gate layer 2004 can electrically couple the active fin 404A under a relatively high gate voltage. In some embodiments, the gate dielectric 2016 may have a critical dimension (CD), e.g., thickness, for each of the portions of the dummy gate dielectric 1022 that are disposed on the top surface of the active fin 404A ($CD_C$) and extended along the sidewalls of the active fin 404A ($CD_B$), respectively.

In the core area 302B, a dummy transistor 2025, adopting the dummy fin 600A as its "structural" channel (instead of a conduction channel), may be formed. In some embodiments, such a dummy transistor may not electrically conduct current along its channel (e.g., no current in the channel 600A). Although not electrically functional, the dummy transistor 2025 may still have a gate dielectric 2026, which includes the gate dielectric layer 2012A and a native oxide layer, if any. The gate dielectric 2026 may have a CD for each of the portions of the native oxide layer that are disposed on the top surface of the dummy fin 600A ($CD_C$) and extended along the sidewalls of the dummy fin 600A ($CD_D$), respectively. Similarly, another dummy transistor 2035, adopting the dummy fin 600B as its structural channel, may be formed. The dummy transistor 2035 may have a gate dielectric 2036, which includes the gate dielectric layer 2012A or 2012B and the remaining dummy gate dielectric 1002. The gate dielectric 2036 may have a CD for each of the portions of the dummy gate dielectric 1002 that are disposed on the top surface of the dummy fin 600B ($CD_E$) and extended along the sidewalls of the dummy fin 600B ($CD_F$), respectively.

Still in the core areas 302B, an active transistor 2045, adopting the active fin 404B as its conduction channel, may be formed. Such an active transistor 2045, with a relatively thin gate dielectric 2046 (which includes the gate dielectric layer 2012A and a native oxide layer, if any), can be configured as a core transistor. Through the relatively thin gate dielectric 2026, the metal gate layer 2014 can electrically couple the active fin 404B under a relatively low gate voltage. The gate dielectric 2046 may have a CD for each of the portions of the native oxide layer that are disposed on the top surface of the active fin 404B ($CD_G$) and extended along the sidewalls of the active fin 404B ($CD_H$), respectively. Similarly, another active transistor 2055, adopting the active fin 404C as its conduction channel and the gate dielectric layer 2012B and a native oxide layer, if any, as its gate dielectric 2056, can be formed as another core transistor. The gate dielectric 2056 may have a CD for each of the portions of the native oxide layer that are disposed on the top surface of the active fin 404C ($CD_I$) and extended along the side-walls of the active fin 404C ($Ca_J$), respectively. In some embodiments, the above-mentioned CDs may follow the relationships: $CD_A \approx CD_E > CD_C \approx CD_G \approx CD_I$; and $CD_B \approx CD_F > CD_D \approx CD_H \approx CD_J$. In some embodiments, $CD_A$, $CD_B$, $CD_E$, and $CD_F$ may range from 50 angstroms (Å) to 70 Å; and $CD_C$, $CD_D$, $CD_G$, $CD_H$, $CD_I$, and $CD_J$ may range from 3 angstroms (Å) to 5 Å. In some alternative embodiments, while forming the cavity 1400 (FIG. 14), a portion of the dummy gate dielectric 1002 exposed by the cavity 1400 may also be removed. As such, $CD_E$ may range from 3 angstroms (Å) to 5 Å.

FIGS. 21, 22, 23, and 24 illustrate example circuit layouts, 2100, 2200, 2300, and 2400, to form a portion of the FinFET device 300, in accordance with various embodiments. For example, each of the circuit layouts 2100-2400 may include a number of patterns to form the transistors 2025-2055 in the core area 302B (FIG. 20). Each of the patterns may correspond to one or more patterning process (e.g., a photolithography process) to make a physical device feature of the transistors 2025-2055. It should be understood that the layouts 2100-2400 are not limited to fabricating FinFETs. The layouts 2100-2400 can also be used to fabricate any of other kinds of transistors such as, for example, nanosheet transistors, gate-all-around (GAA) transistors, vertical transistors, etc., while remaining within the scope of the present disclosure.

Figure 21:
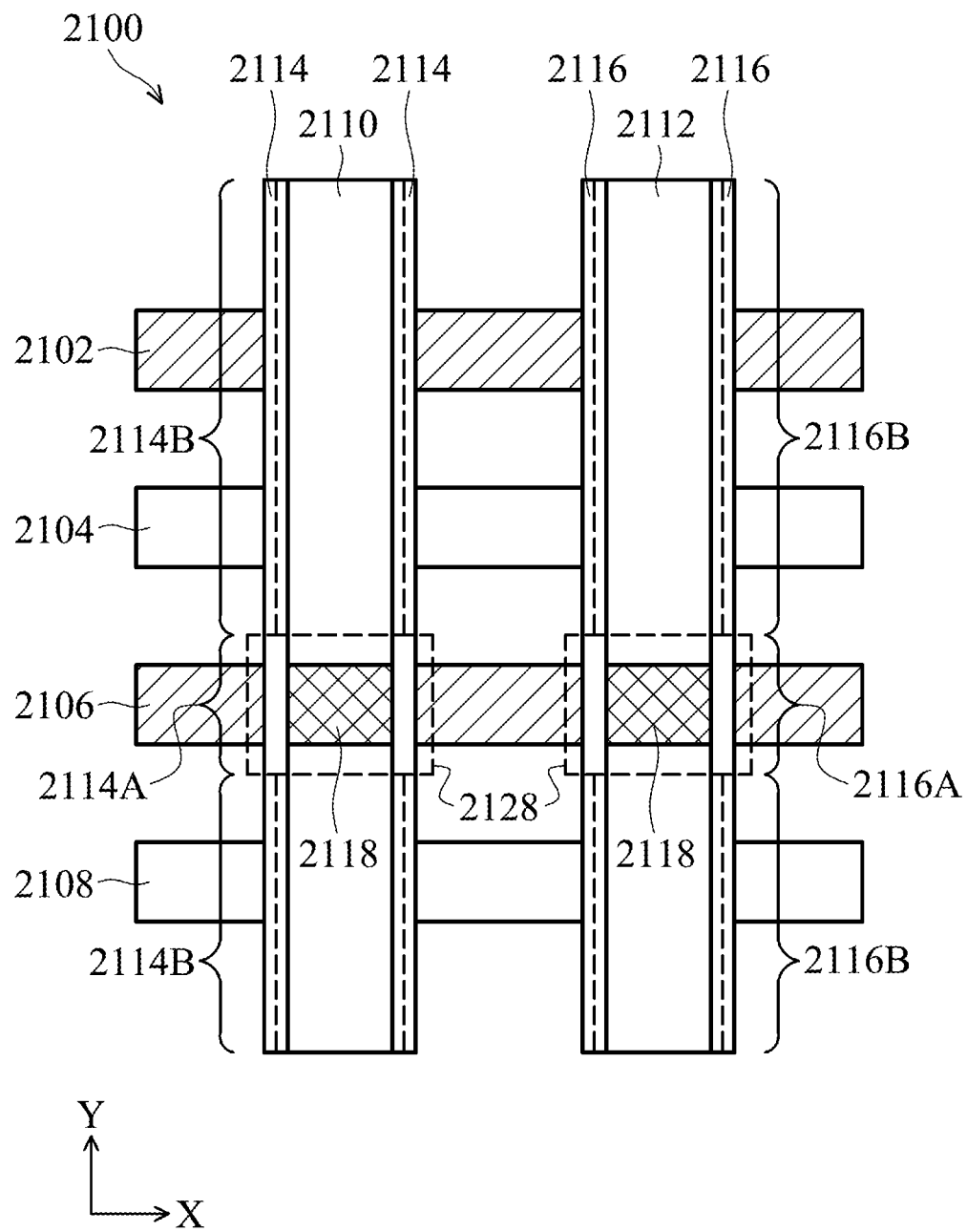
FIG. 21 illustrates an example circuit layout to make some device features of the example FinFET device of FIGS. 3-20, in accordance with some embodiments.

Referring first to FIG. 21, the layout 2100 includes fin patterns 2102, 2104, 2106, and 2108 extending along a first direction (e.g., the X direction); and gate patterns 2110 and 2112 extending along a second direction (e.g., the Y direction). The fin patterns may each be used to define a channel, a source region and/or a drain region of the respective transistor; and the gate patterns may each be used to define a gate feature of the respective transistor.

For example, the fin patterns 2102, 2104, 2106, and 2108 can correspond to the fins 600A, 404B, 600B, and 404C (see, e.g., FIG. 20), respectively; and the gate patterns 2110 and 2112 can correspond to the dummy gate structures 1000A and 1000B, respectively (see, e.g., FIGS. 11-13). Along each of the gate patterns 2110 and 2112, gate spacer patterns may also be included in the layout 2100. For example, gate spacer patterns 2114 are extended along the sides of the gate pattern 2110, which can correspond to the gate spacers 1100 along the dummy gate structure 1000A (see, e.g., FIGS. 11-13); and gate spacer patterns 2116 are extended along the sides of the gate pattern 2112, which can correspond to the gate spacers 1100 along the dummy gate structure 1000B (see, e.g., FIGS. 11-13). Further, the layout 2100 includes gate isolation patterns 2118, which can correspond to the cavity 1400 or the gate isolation structure 1500 (see, e.g., FIGS. 14-15). Still further, the layout 2100 includes mask patterns 2128, which can correspond to the mask 1704 (see, e.g., FIG. 17).

As described above, the fin pattern 2106 can be used to define the dummy fin 600B, followed by using the gate pattern 2110/2112 to form the dummy gate structures 1000A/B. Next, portions of the dummy gate structures 1000A/1000B are replaced with the gate isolation structures 1500 based on the gate isolation patterns 2118. As shown in the example of FIG. 21, the mask pattern 2128 is configured to overlap portions of the fin pattern 2106 (i.e., a portion of the dummy fin 600B). Specifically, the mask pattern 2128 can overlap the portions of the fin pattern 2106 that are overlapped with the gate isolation pattern 2118, thereby forming the mask(s) 1704. In some embodiments, the mask pattern 2128 can also overlap portions of the gate spacer pattern 2114 and 2116, e.g., 2114A and 2116A, as shown.

Accordingly, the overlapped portions of the gate spacer patterns 2114A and 2116A can result in a corresponding portion of the gate spacers 1100 having a greater width (along the X direction) than other portions of the gate spacers 1100 corresponding to the portions of the gate spacers 2114 and 2116 that are not overlapped with the mask pattern 2128, e.g., 2114B and 2116B. For purposes of illustration, the portions of the gate spacer patterns 2114 and 2116 (e.g., 2114B, 2116B) that present a less width are indicted by dotted lines, as shown in FIG. 21.

Figure 22:
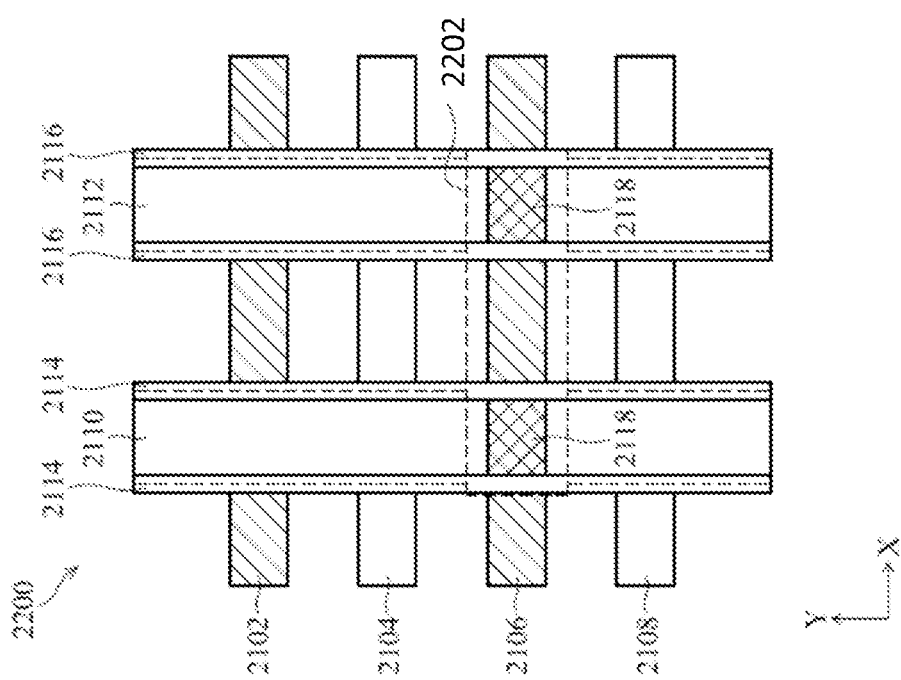
FIG. 22 illustrates another example circuit layout to make some device features of the example FinFET device of FIGS. 3-20, in accordance with some embodiments.
Figure 23:
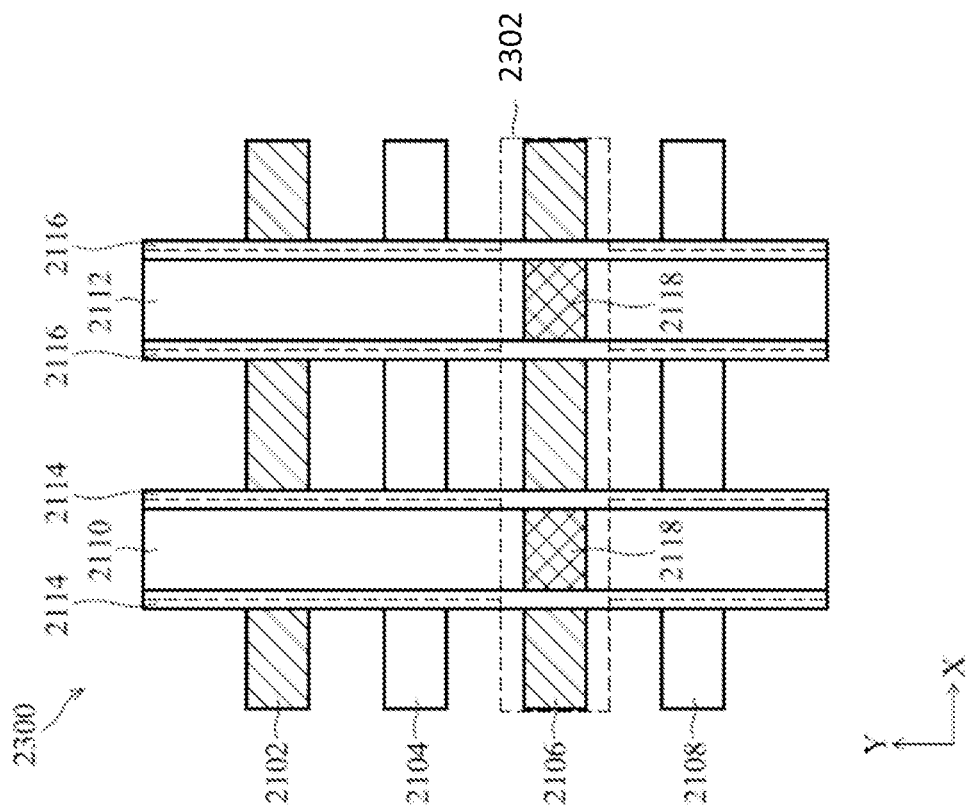
FIG. 23 illustrates yet another example circuit layout to make some device features of the example FinFET device of FIGS. 3-20, in accordance with some embodiments.
Figure 24:
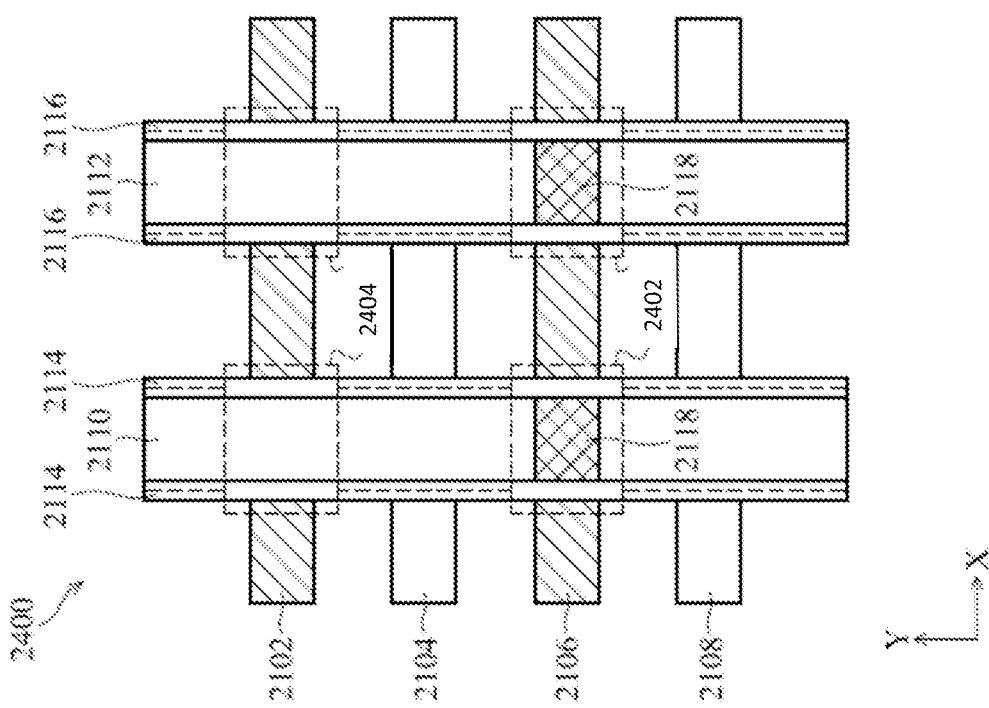
FIG. 24 illustrates yet another example circuit layout to make some device features of the example FinFET device of FIGS. 3-20, in accordance with some embodiments.
Figure 25:
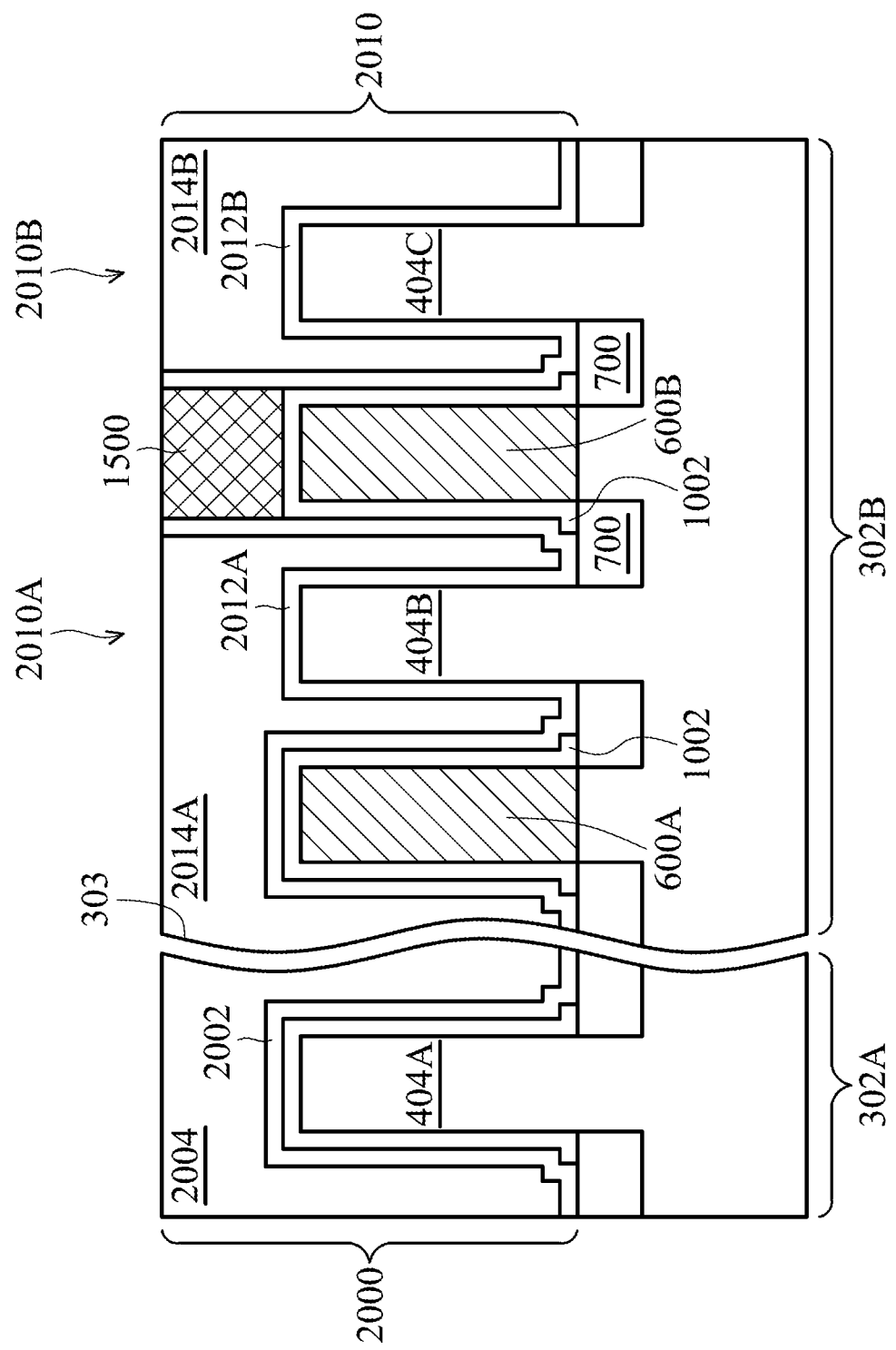
FIG. 25 illustrates a cross-sectional view of an example FinFET device (or a portion of the example FinFET device) during one of various fabrication stages, made according to the layout of FIG. 24, in accordance with some embodiments.

The layouts 2200, 2300, and 2400 are each similar to the layout 2100, except for the different configurations of respective mask patterns. Thus, the reference numerals used in FIG. 21 for the fin patterns, gate patterns, gate spacer patterns, and gate isolation patterns will be repeatedly used in FIGS. 22-24, and the layouts 2200-2400 will be briefly discussed as follows. Referring to FIG. 22, in addition to overlapping the fin pattern 2106 overlapped by the gate isolation patterns 2118, mask pattern 2202 overlaps a portion of the fin pattern 2106 that is disposed between the two gate isolation patterns 2118. Referring to FIG. 23, mask pattern 2302 overlaps the whole of the fin pattern 2106, which includes the two gate isolation patterns 2118. Referring to FIG. 24, in addition to using mask pattern 2402 to overlap portions of the fin pattern 2106 that are overlapped by the gate isolation patterns 2118, the layout 2400 includes mask pattern 2404 to overlap portions of the fin pattern 2102 that are not overlapped by any gate isolation patterns. FIG. 25 illustrates a cross-sectional view of the FinFET device 300 that is formed according to the layout 2400. FIG. 25 is similar to FIG. 20 except that, in addition to the dummy fin 600A being overlaid by the dummy gate dielectric 1002 (because of the mask pattern 2402), the dummy fin 600B is overlaid by a portion of the dummy gate dielectric 1002 that remains intact because of the mask pattern 2404.

Similar to the layout 2100 with respect to FIG. 21, in each of the layouts 2200-2400 of FIGS. 22-24, the overlapped portions of the gate spacer patterns can result in a corresponding portion of the gate spacers 1100 having a greater width (along the X direction) than other portions of the gate spacers 1100 corresponding to the portions of the gate spacers that are not overlapped with the mask pattern(s). For purposes of illustration, the portions of the gate spacer patterns 2114 and 2116 that present a less width are indicted by dotted lines, as shown in FIGS. 22, 23, and 24, respectively.

In one aspect of the present disclosure, a method of making a semiconductor device is disclosed. The method includes forming a first fin and a second fin over a substrate. The method includes forming a first dummy gate structure that straddles the first fin and the second fin. The first dummy gate structure includes a first dummy gate dielectric and a first dummy gate disposed over the first dummy gate dielectric. The method includes replacing a portion of the first dummy gate with a gate isolation structure. The portion of the first dummy gate is disposed over the second fin. The method includes removing the first dummy gate. The method includes removing a first portion of the first dummy gate dielectric around the first fin, while leaving a second portion of the first dummy gate dielectric around the second fin intact. The method includes forming a gate feature straddling the first fin and the second fin, wherein the gate isolation structure intersects the gate feature.

In another aspect of the present disclosure, a method of making a semiconductor device is disclosed. The method includes forming a semiconductor fin and a dielectric fin extending along a first direction on a substrate. A respective central portion of each of the semiconductor fin and the dielectric fin is overlaid by a dummy gate structure that includes a dummy gate dielectric and a dummy gate disposed over the dummy gate dielectric. The dummy gate structure extends along a second direction perpendicular to the first direction. The method includes removing a portion of the dummy gate disposed above the dielectric fin to form a cavity. The method includes filling the cavity with a dielectric material to form gate isolation structure. The method includes removing a remaining portion of the dummy gate. The method includes covering a first portion of the dummy gate dielectric around the dielectric fin with a mask. The method includes removing a second portion of the dummy gate dielectric around the semiconductor fin, while leaving the first portion of the dummy gate dielectric intact using the mask. The method includes forming a gate feature straddling the semiconductor fin and the dielectric fin, with the gate isolation structure traversing the gate feature.

In yet another aspect of the present disclosure, a semiconductor device is disclosed. The semiconductor device includes a semiconductor fin extending along a first direction. The semiconductor device includes a dielectric fin extending along the first direction. The semiconductor device includes a gate isolation structure disposed over the dielectric fin. The semiconductor device includes a metal gate layer, extending along a second direction perpendicular to the first direction, that straddles the semiconductor fin and the dielectric fin. The metal gate layer is electrically coupled to the semiconductor fin, and is traversed by the gate isolation structure and a dummy gate dielectric. The dummy gate dielectric is disposed between a top surface of the dielectric fin and the gate isolation structure and extended along sidewalls of the dielectric fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, comprising:
   forming a semiconductor fin and a dielectric fin extending along a first direction on a substrate, wherein a portion of the semiconductor fin and a portion of the dielectric fin are overlaid by a dummy gate structure, and wherein the dummy gate structure includes a dummy gate dielectric and a dummy gate, and extends along a second direction perpendicular to the first direction;
   removing a portion of the dummy gate disposed above the dielectric fin to form a cavity;
   filling the cavity with a dielectric material to form a gate isolation structure;
   removing a remaining portion of the dummy gate;
   covering a first portion of the dummy gate dielectric around the dielectric fin with a mask;

removing a second portion of the dummy gate dielectric around the semiconductor fin, while leaving the first portion of the dummy gate dielectric intact using the mask; and forming a gate feature straddling the semiconductor fin and the dielectric fin, with the gate isolation structure traversing the gate feature.

2. The method of claim 1, wherein the first portion of the dummy gate dielectric is disposed between a top surface of the dielectric fin and the gate isolation structure and extends along sidewalls of the dielectric fin, and wherein the second portion of the dummy gate dielectric is disposed over a top surface of the semiconductor fin and extends along sidewalls of the semiconductor fin.

3. The method of claim 1, wherein the mask overlays the gate isolation structure.

4. The method of claim 1, wherein the mask overlays the entire dielectric fin.

5. The method of claim 1, further comprising forming a gate spacer extending along sidewalls of the dummy gate structure, each of the sidewalls having a surface direction parallel to the first direction.

6. The method of claim 5, wherein the step of removing a second portion of the dummy gate dielectric around the semiconductor fin comprises removing a first portion of the gate spacer that straddles the semiconductor fin while leaving a second portion of the gate spacer that straddles the dielectric fin intact.

7. The method of claim 1, wherein the gate feature includes a high-k dielectric layer and at least one work function layer.

8. The method of claim 1, wherein the semiconductor fin is configured as an active channel and the dielectric fin is configured as a dummy channel, and wherein the semiconductor fin and the dielectric fin are disposed adjacent to each other in the same area of the substrate.

9. The method of claim 1, wherein the dielectric material of the gate isolation structure is selected from a group consisting of: silicon oxide, silicon nitride, silicon oxynitride, silicon carbide, silicon carbonitride, silicon oxycarbonitride, silicon oxycarbide, and combinations thereof.

10. A method of making a semiconductor device, comprising:

forming a first semiconductor fin and a first dielectric fin over a substrate;

forming a first dummy gate structure that straddles the first semiconductor fin and the first dielectric fin, wherein the first dummy gate structure comprises a first dummy gate dielectric and a first dummy gate disposed over the first dummy gate dielectric;

replacing a portion of the first dummy gate with a gate isolation structure, wherein the portion of the first dummy gate is disposed over the first dielectric fin;

removing the first dummy gate;

removing a first portion of the first dummy gate dielectric around the first semiconductor fin, while leaving a second portion of the first dummy gate dielectric around the first dielectric fin intact; and forming a gate feature straddling the semiconductor fin and the dielectric fin, wherein the gate isolation structure intersects the gate feature.

11. The method of claim 10, wherein the first semiconductor fin and the first dielectric fin extend along the same direction and are adjacent to each other in a first area of the substrate.

12. The method of claim 11, wherein the first semiconductor fin is configured as a first active channel in the first area and the first dielectric fin is configured as a first dummy channel in the first area.

13. The method of claim 12, further comprising:

forming a second semiconductor fin, configured as a second active channel, in a second area of the substrate;

forming a second dummy gate structure that straddles the second semiconductor fin, wherein the second dummy gate structure comprises a second dummy gate dielectric and a second dummy gate disposed over the second dummy gate dielectric;

forming a second dielectric fin in the first area of the substrate, wherein the second dielectric fin is configured as a second dummy channel and wherein the first dummy gate structure also straddles the second dielectric fin; and when removing the first portion of the first dummy gate dielectric, removing a third portion of the first dummy gate dielectric around the second dielectric fin while leaving the second dummy gate dielectric around the second semiconductor fin intact;

wherein the gate feature also straddles the second dielectric fin, with no gate isolation structure disposed over the second dielectric fin.

14. The method of claim 13, wherein a first transistor, having the first active channel, includes a first gate dielectric with a first thickness, and a second transistor, having the second active channel, includes a second gate dielectric with a second thickness, the second thickness being greater than the first thickness.

15. The method of claim 13, wherein a first density of transistors formed in the first area is greater than a second density of transistors formed in the second area.

16. The method of claim 10, wherein the first portion of the first dummy gate dielectric is disposed over a top surface of the first semiconductor fin and extends along sidewalls of the first semiconductor fin, and wherein the second portion of the first dummy gate dielectric is disposed between a top surface of the first dielectric fin and the gate isolation structure and extends along sidewalls of the first dielectric fin.

17. The method of claim 10, wherein the step of removing a first portion of the first dummy gate dielectric around the first semiconductor fin comprises forming a mask overlaying the entire first dielectric fin.

18. The method of claim 10, wherein the step of removing a first portion of the first dummy gate dielectric around the first semiconductor fin further comprises forming a mask overlaying the gate isolation structure.

19. A method of making a semiconductor device, comprising:

forming a first semiconductor fin, a second semiconductor fin, and a dielectric fin over a substrate, wherein the first semiconductor fin, the second semiconductor fin, and the dielectric fin are in parallel with each other, and the dielectric fin is interposed between the first and second semiconductor fins;

forming a dummy gate structure that straddles respective portions of the first semiconductor fin, the second semiconductor fin, and the first dielectric fin, wherein the dummy gate structure comprises a dummy gate dielectric and a dummy gate disposed over the dummy gate dielectric;

replacing a first portion of the dummy gate disposed over the dielectric fin with a gate isolation structure;

removing a second portion of the dummy gate;

removing a first portion of the dummy gate dielectric around the first and second semiconductor fins, while leaving at least a second portion of the dummy gate dielectric between the dielectric fin and the gate isolation structure intact; and forming a first portion and a second portion of a gate feature straddling the first semiconductor fin and second semiconductor fin, respectively, wherein the gate isolation structure and the dielectric fin collectively isolate the first portion of the gate feature and the second portion of the gate feature from each other.

20. The method of claim 19, wherein the gate isolation structure include a dielectric material selected from a group consisting of: silicon oxide, silicon nitride, silicon oxynitride, silicon carbide, silicon carbonitride, silicon oxycarbonitride, silicon oxycarbide, and combinations thereof.

* * * * *